US012322666B2

(12) United States Patent
Lin et al.

(10) Patent No.: US 12,322,666 B2
(45) Date of Patent: Jun. 3, 2025

(54) PACKAGE ASSEMBLY LID AND METHODS FOR FORMING THE SAME

(71) Applicant: Taiwan Semiconductor Manufacturing Company Limited, Hsinchu (TW)

(72) Inventors: Yu-Sheng Lin, Zhubei (TW); Shu-Shen Yeh, Taoyuan (TW); Chien-Shen Chen, Hsinchu (TW); Po-Yao Lin, Zhudong Township (TW); Shin-Puu Jeng, Po-Shan Village (TW); Ming-Chih Yew, Hsinchu (TW); Chin-Hua Wang, New Taipei (TW); Po-Chen Lai, Hsinchu (TW); Chia-Kuei Hsu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 401 days.

(21) Appl. No.: 17/750,428

(22) Filed: May 23, 2022

(65) Prior Publication Data

US 2023/0378007 A1 Nov. 23, 2023

(51) Int. Cl.
 *H01L 23/10* (2006.01)
 *H01L 21/48* (2006.01)
 (Continued)

(52) U.S. Cl.
 CPC ........ *H01L 23/055* (2013.01); *H01L 21/4871* (2013.01); *H01L 23/10* (2013.01);
 (Continued)

(58) Field of Classification Search
 CPC ....... H01L 23/055; H01L 23/10; H01L 23/16; H01L 23/3128; H01L 23/42; H01L 23/5385; H01L 23/49816; H01L 23/5384; H01L 23/3675; H01L 23/562; H01L 21/56; H01L 21/563; H01L 21/42; H01L 2224/16235; H01L 2224/32225; H01L 2224/73204; H01L 2224/15311;
 (Continued)

(56) References Cited

U.S. PATENT DOCUMENTS

2015/0162307 A1* 6/2015 Chen ..................... H01L 21/56
 438/107
2020/0194542 A1* 6/2020 Alapati ............... H01L 23/3675
 (Continued)

OTHER PUBLICATIONS

Matweb Reference for CTE values of Kovar and Silver (Year: 1996).*

*Primary Examiner* — Peniel M Gumedzoe
*Assistant Examiner* — Douglas Yap
(74) *Attorney, Agent, or Firm* — The Marbury Law Group, PLLC

(57) ABSTRACT

A package assembly includes a package substrate, an interposer module on the package substrate, and a package lid on the interposer module and attached to the package substrate. The package lid includes an outer lid including an outer lid material and including an outer lid plate portion. The package lid further includes an inner lid including an inner lid material different than the outer lid material and including an inner lid plate portion attached to a bottom surface of the outer lid plate portion.

20 Claims, 17 Drawing Sheets

(51) Int. Cl.
*H01L 23/00* (2006.01)
*H01L 23/055* (2006.01)
*H01L 25/065* (2023.01)

(52) U.S. Cl.
CPC .......... *H01L 25/0655* (2013.01); *H01L 24/16* (2013.01); *H01L 24/32* (2013.01); *H01L 24/73* (2013.01); *H01L 2224/16235* (2013.01); *H01L 2224/32225* (2013.01); *H01L 2224/73204* (2013.01); *H01L 2924/15311* (2013.01); *H01L 2924/1611* (2013.01); *H01L 2924/16153* (2013.01); *H01L 2924/16251* (2013.01); *H01L 2924/1631* (2013.01); *H01L 2924/1632* (2013.01); *H01L 2924/1811* (2013.01); *H01L 2924/182* (2013.01); *H01L 2924/35121* (2013.01)

(58) Field of Classification Search
CPC ... H01L 2224/1611; H01L 2224/16153; H01L 2224/16251; H01L 2224/1631; H01L 2224/1632; H01L 2224/1811; H01L 2224/182; H01L 2224/35121; H01L 2924/161; H01L 2924/1611; H01L 21/4871; H01L 21/4882; H01L 21/4878; H01L 21/4875
See application file for complete search history.

(56) References Cited

U.S. PATENT DOCUMENTS

| 2022/0093528 A1* | 3/2022 | Hu | H01L 25/18 |
| 2022/0310474 A1* | 9/2022 | Yeh | H01L 24/33 |

* cited by examiner

PACKAGE ASSEMBLY LID AND METHODS FOR FORMING THE SAME

BACKGROUND

A package assembly may include an interposer module mounted on a package substrate. The package assembly may also include a package lid mounted on the package substrate over the interposer module. The package lid may be attached to the substrate by using an adhesive. Designing the package assembly so as to mitigate package stress may be challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
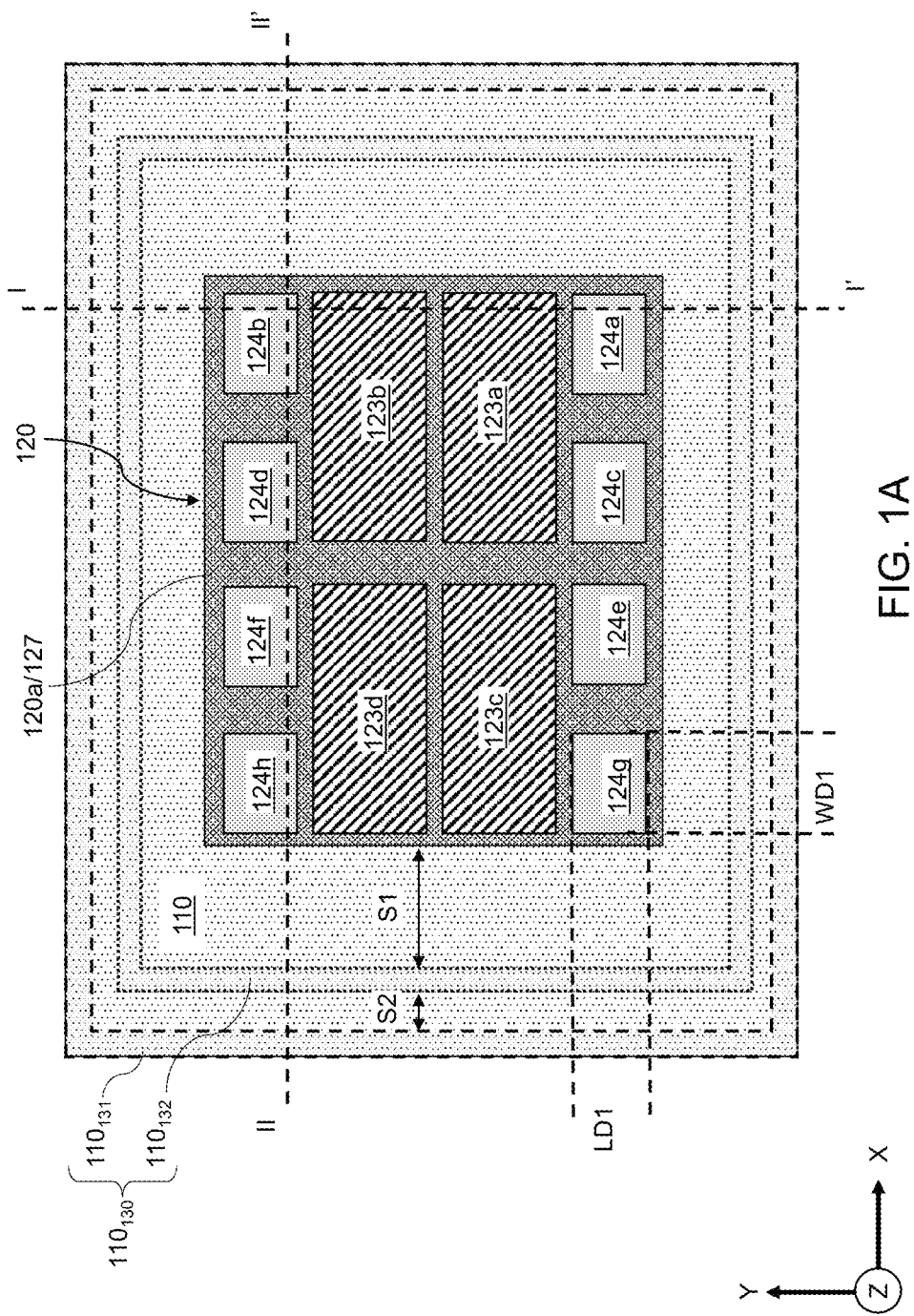
FIG. 1A is a plan view of a package assembly (e.g., organic/silicon interposer package), according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A conventional package assembly may include a package lid with an outer foot around the periphery of the package lid. However, conventional package lids may experience a problem where a material in the package assembly (e.g., a material such as a polymer material that may include, for example, underfill material, molding material, etc.) may crack or delaminate. Such cracking and/or delamination may impact package reliability. Package assembly manufacturers have attempted to solve the problem by increasing the rigidity of the materials in the package assembly. However, finding a suitable material, especially for a package assembly with a large reticle size, is difficult.

Various embodiments of the present disclosure may include a package assembly having a package lid (e.g., dual lid) including an outer lid and an inner lid. The inner lid may be fixed, for example, to a bottom surface of the outer lid. The package lid may have a novel structure (e.g., a novel appearance) and employ a material having a low (e.g., ultra-low) coefficient of thermal expansion (CTE) as the inner lid. In some embodiments, the outer lid may be polished in order to accommodate the inner lid. The features of the package assembly (e.g., the dual lid) may help to achieve polymer material stress mitigation (e.g., mitigate polymer material crack and delamination risk) and, thereby increase the reliability of package assembly.

Various embodiments of the package assembly may include a package substrate, an interposer module on the package substrate and a package lid (dual lid) on the interposer module. In at least one embodiment, the package assembly may also include a thermal interface material (TIM) film on the interposer module, and the package lid may be located on the TIM film. The package lid may include an outer lid (outer package lid) and an inner lid (inner package lid). The outer lid may be connected to the package substrate by an adhesive (e.g., first adhesive). The outer lid may be polished in order to accommodate the inner lid. The inner lid may be connected to the package substrate by an adhesive (e.g., second adhesive).

The interposer module may be connected to the package substrate by one or more first interconnect structures (e.g., C4 bumps). A package underfill layer may be formed around the first interconnect structures. The interposer module may include an interposer (e.g., organic interposer or inorganic interposer) and one or more semiconductor devices (e.g., system on chip (SOC) devices, chip on wafer (COW) devices, high bandwidth memory (HBM) devices, etc.) on the interposer. The interposer module may also include one or more second interconnect structures (e.g., microbumps) connecting the semiconductor devices to the interposer. The interposer module may also include an interposer underfill material formed around the second interconnect structures, and a molding material layer on the semiconductor devices.

The outer lid may have a first coefficient of thermal expansion (CTE). The inner lid may have a second CTE that is low (e.g., ultra-low). The second CTE of the inner lid may be less than the first CTE of the outer lid. In particular, the second CTE may be less than 3 ppm/° C. (i.e., $3 \times 10^{-6}$° $C.^{-1}$). The inner lid may include a low CTE material (e.g., a material having a CTE less than 3 ppm/° C.) such as a nickel-iron, low-expansion alloy containing 36% nickel (e.g., INVAR36). The outer lid may have a first height H1 and the inner lid may have a second height H2. The ratio (H2/H1) of second height H2 to first height H1 may satisfy the following: 3.5>H2/H1>0.

In a plan view, the outer lid may include outwardly projecting portions. The inner lid including a low CTE material may be designed to cover a high CTE region (e.g., polymer material; COW polymer region) in the interposer module and mitigate stress that may exist in a conventional package assembly between the material of the outer lid (e.g., ring) and the polymer material. In particular, the inner lid may include inwardly-projecting portions that may separate the outwardly-projecting portions in the plan view. The outwardly-projecting portions may have a size and shape corresponding to a size and shape of the one or more semiconductor devices in the interposer module. For example, where the semiconductor devices have a width WD1 and a length LD1, and the outwardly projecting portion may have a width WL1 and a length LL1, WD1 may be greater than or equal to WL1 which is greater than zero, and LD1 may be greater than or equal to LL1 which is greater than zero. The inwardly-projecting portions may have a size and shape corresponding to a spacing between the plurality of semiconductor devices in the interposer module.

In at least one embodiment, the inner lid may include low CTE material (i.e., CTE<3 ppm/° C.). The inner lid may be located over a molding material layer or underfill material which may include an epoxy material (e.g., epoxy molding compound). In general, an epoxy material may typically have a high CTE (i.e., CTE>10 ppm/° C.). By locating an inner lid having a low CTE on the epoxy material having a high CTE, a risk of crack or delamination may be mitigated.

Referring now to the drawings, FIGS. 1A-1D illustrate a package assembly 100, according to one or more embodiments. In particular, FIG. 1A is a plan view of a package assembly 100 (e.g., organic/silicon interposer package), according to one or more embodiments. The package assembly 100 may include a package substrate 110 and an interposer module 120 on the package substrate 110 (e.g., mounted on the package substrate 110). In at least one embodiment, the package assembly 100 may include a large reticle size (e.g., at least about 1700 mm² or 2 reticle size).

Figure 1B:
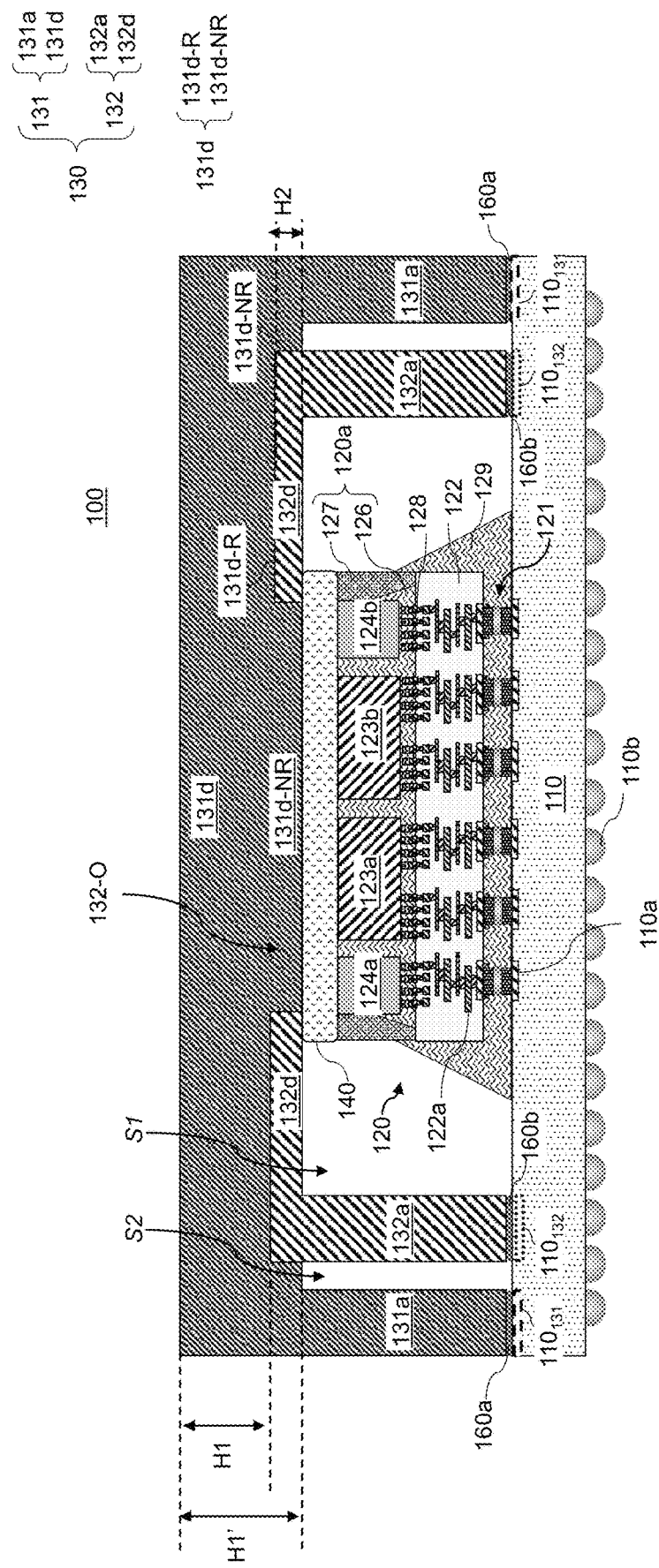
FIG. 1B is a vertical cross-sectional view of the package assembly along lines I-I' in FIG. 1A, according to one or more embodiments.

The package assembly 100 may also include a package lid 130 that may include an outer lid 131 and an inner lid 132 (e.g., see FIG. 1B). For ease of explanation, FIG. 1A does not show the package lid 130, but shows a package lid attachment portion $110_{130}$ of the package substrate 110 where the package lid 130 may be attached to the package substrate 110. The package lid attachment portion $110_{130}$ may include an outer lid attachment portion $110_{131}$ (shown by dashed lines) where the outer lid 131 may be attached to the package substrate 110. The package lid attachment portion $110_{130}$ may also include an inner lid attachment portion $110_{132}$ (shown by dotted lines) where the inner lid 132 may be attached to the package substrate 110.

The inner lid attachment portion $110_{132}$ may be separated from the interposer module 120 by the space S1. The space S1 may be formed around an entire perimeter of the interposer module 120. The outer lid attachment portion $110_{131}$ may be separated from the inner lid attachment portion $110_{132}$ by the space S2. The space S2 may be formed around an entire perimeter of the inner lid attachment portion $110_{132}$. The space S1 may have a width in the x-direction that is greater than a width of the space S2 in the x-direction. The space S1 may also have a width (e.g., in the y-direction) that is greater than a width of the space S2 (e.g., in the y-direction). The width of the space S1 may be the same or may vary around the perimeter of the interposer module 120. The width of the space S2 may be the same or may vary around the perimeter of the inner lid attachment portion $110_{132}$.

As illustrated in FIG. 1A, the interposer module 120 may include primary semiconductor devices 123a-123d. Although four (4) primary semiconductor devices are shown in FIG. 1A, the package assembly 100 may include any number of primary semiconductor devices. The primary semiconductor devices 123a-123d may be located in a central region (in the plan view) of the interposer module 120. The primary semiconductor devices 123a-123d may be substantially aligned in the x-direction and y-direction. For example, primary semiconductor device 123a may be substantially aligned with primary semiconductor device 123c in the x-direction, primary semiconductor device 123a may be substantially aligned with primary semiconductor device 123b in the y-direction, and so on.

The package assembly 100 may also include secondary semiconductor devices 124a-124h. One or more of the secondary semiconductor devices 124a-124h may have a width WD1 in the x-direction and a length LD1 in the y-direction. Although eight (8) secondary semiconductor devices are shown in FIG. 1A, the package assembly 100 may include any number of secondary semiconductor devices. The secondary semiconductor devices 124a-124h may be located around a periphery of the primary semiconductor devices 123a-123d and outside the central region of the interposer module 120 (in the plan view). In particular, the secondary semiconductor devices 124a-124h may be located on opposing sides of the primary semiconductor devices 123a-123d in the y-direction. The secondary semiconductor devices 124a-124h may be substantially aligned in the x-direction and y-direction. For example, secondary semiconductor device 124a may be substantially aligned with secondary semiconductor devices 124c, 124e and 124g in the x-direction, and secondary semiconductor device 124a may be substantially aligned with secondary semiconductor device 124b in the y-direction, and so on.

The interposer module 120 may include a molding material layer 127 that may be on, around and/or in-between the primary semiconductor devices 123a-123d and the secondary semiconductor devices 124a-124h. The molding material layer 127 may be formed of an epoxy molding compound (EMC).

The interposer module 120 may also include a high CTE region 120a on, around and/or in-between the primary semiconductor devices 123a-123d and the secondary semiconductor devices 124a-124h. As illustrated in FIG. 1A, the high CTE region 120a may be co-extensive with the molding material layer 127. However, in at least one embodiment, the high CTE region 120a may include a material (e.g., a high CTE material such as interposer underfill material) other than the molding material layer 127.

In at least one embodiment, the high CTE region 120a may include any portion of the interposer module 120 (in a plan view) that is outside the periphery of the primary semiconductor devices 123a-123d and secondary semiconductor devices 124a-124h. The high CTE region 120a may include a high CTE material having a CTE that is greater than a CTE of the primary semiconductor devices 123a-123d and greater than a CTE of the secondary semiconductor devices 124a-124h. In at least one embodiment, the high CTE material in the high CTE region 120a may have a CTE that is greater than 3 ppm/° C. (i.e., $3\times10^{-6}$ $C^{-1}$). In at least one embodiment, the high CTE material may include a molding material, an underfill material, or some combination of molding material and underfill material. Any portion of the interposer module 120 (in a plan view) that is outside the high CTE region 120a may include a material having a CTE that is less than the CTE of the high CTE region 120a.

FIG. 1B is a vertical cross-sectional view of the package assembly 100 according to one or more embodiments. In particular, FIG. 1B is a vertical cross-sectional view along lines I-I' in FIG. 1A.

As illustrated in FIG. 1B, in addition to the package substrate 110 and interposer module 120, the package assembly 100 may include a package lid 130. The package assembly 100 may also include a TIM film 140 formed on the interposer module 120. The TIM film 140 may include, for example, a thermal paste, thermal adhesive, thermal gap filler, thermal pad (e.g., silicone), thermal tape, a graphite film, and a carbon nanotube film. The TIM film 140 may also include a gel material. The gel material may include, for example, a cross-linked polymer such as a cross-linked siloxane polymer (e.g., a polymeric organic silicone having a backbone of alternating silicon-oxygen [Si—O] units with organic side chains attached to each silicon atom). Other types of TIM films are within the contemplated scope of this disclosure.

The package substrate 110 may include any substrate that can support a package assembly including, for example, a system on integrated substrate (SoIS), a printed circuit board (PCB), etc. In one or more embodiments, the package substrate 110 may include a core substrate (e.g., polymer substrate), an upper insulating layer (e.g., chip-side insulating layer) formed on the core substrate, and a lower insulating layer (e.g., board-side insulating layer) formed on the core substrate opposite the upper insulating layer. In one or more embodiments, the core substrate, upper insulating layer and lower insulating layer may include, for example, a dielectric polymer material such as polyimide (PI), benzocyclobutene (BCB), or polybenzobisoxazole (PBO). Other suitable dielectric materials are within the contemplated scope of disclosure. The outer lid attachment portion $110_{131}$ and inner lid attachment portion $110_{132}$ of the package substrate 110 may be located on a surface of the package substrate 110 (e.g., a chip-side surface of the package substrate 110).

The package substrate 110 may also include metal interconnects (e.g., metal traces and metal vias) to provide an electrical connection of the package substrate 110. The package substrate 110 may also include metal bonding pads 110a formed in the chip-side surface of the package substrate 110, for providing an electrical connection to a semiconductor device (e.g., interposer module, semiconductor die, etc.) that is mounted on the package substrate 110. The metal interconnects in the package substrate 110 and the metal bonding pads 110a may include one or more layers of metals, metal alloys, and/or or other metal-containing compounds (e.g., Cu, Al, Mo, Co, Ru, W, Cr, Ni, Sn, Ti, Ta, Au, TiN, TaN, WN, etc.). Other conductive materials are within the contemplated scope of this disclosure.

A ball-grid array (BGA) including a plurality of solder balls 110b may be formed on a board-side surface of the package substrate 110 that is opposite to the chip-side surface of the package substrate 110. The solder balls 110b may allow the package assembly 100 to be securely mounted on a substrate such as a printed circuit board (PCB) and electrically coupled to the substrate. The solder balls 110b may be electrically connected to the metal bonding pads 110a by the metal interconnects and through vias in the package substrate 110. The solder balls 110b may include, for example, a lead-free solder material (e.g., SAC405). The solder material may include tin and another element such as silver, indium, antimony, bismuth, zinc, etc.

The interposer module 120 may be mounted by first interconnect structures 121 on the metal bonding pads 110a in the package substrate 110. The first interconnect structures 121 may include, for example, C4 bumps. The first interconnect structures 121 may include, for example, an upper bump (e.g., copper pillar), solder joint (Sn) and lower pad (e.g., copper and/or nickel) scheme.

The interposer module 120 may include an interposer 122 (interposer dielectric layer) that may include metal interconnects 122a connected to the first interconnect structures 121. The interposer 122 may include one or more organic layers (e.g., polymer layers) and/or one or more inorganic layers (e.g., silicon layers). In at least one embodiment, the interposer 122 may include a plurality of dielectric polymer layers including a dielectric polymer material such as polyimide (PI), benzocyclobutene (BCB), or polybenzobisoxazole (PBO). The metal interconnects 122a may include one or more layers of metals, metal alloys, and/or or other metal-containing compounds (e.g., Cu, Al, Mo, Co, Ru, W, Cr, Ni, Sn, Ti, Ta, Au, TiN, TaN, WN, etc.). Other conductive materials are within the contemplated scope of this disclosure.

The primary semiconductor devices 123a-123d and secondary semiconductor devices 124a-124h may be mounted on the interposer 122 by one or more second interconnect structures 128. Each of the primary semiconductor devices 123a-123d and secondary semiconductor devices 124a-

124*h* may include, for example, a semiconductor die, a system on chip (SOC) die, a system on integrated chips (SoIC) die, and a high-bandwidth memory (HBM) die. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS) technology or integrated fan-out on substrate (INFO-oS) technology. Other types of semiconductor devices are within the contemplated scope of this disclosure.

The second interconnect structures 128 may include micro-bumps that may be electrically connected to the metal interconnects 122*a*. The second interconnect structures 128 may have a design that is substantially similar to or different than the first interconnect structures 121. The second interconnect structures 128 may include, for example, an upper bump (e.g., copper pillar), solder joint (Sn) and lower pad (e.g., copper and/or nickel) scheme.

A package underfill layer 129 may be formed under and around the interposer module 120 and the first interconnect structures 121 so as to fix the interposer module 120 to the package substrate 110. The package underfill layer 129 may be formed of an epoxy-based polymeric material.

An interposer underfill layer 126 may be formed around the second interconnect structures 128 and between the primary semiconductor devices 123*a*-123*d* and the interposer 122, and between the secondary semiconductor devices 124*a*-124*h* and the interposer 122. The interposer underfill layer 126 may also be formed between the primary semiconductor devices 123*a*-123*d* and secondary semiconductor devices 124*a*-124*h*, between each of the primary semiconductor devices 123*a*-123*d*, and between each of the secondary semiconductor devices 124*a*-124*h*.

The interposer underfill layer 126 may be formed as separate portions. For example, the interposer underfill layer 126 may include a first portion under one or more of the primary semiconductor devices 123*a*-123*d*, a second portion under one or more of the secondary semiconductor devices 124*a*-124*h*, and so on. Alternatively, as illustrated in FIG. 1B, the interposer underfill layer 126 may be formed continuously as one layer under all of the primary semiconductor devices 123*a*-123*d* and secondary semiconductor devices 124*a*-124*h*. The interposer underfill layer 126 may also be formed of an epoxy-based polymeric material.

The molding material layer 127 may also be formed on the interposer underfill layer 126 and the interposer 122. As illustrated in FIG. 1B, an upper surface of the molding material layer 127 and an upper surface of the interposer underfill layer 126 may be substantially co-planar. In particular, the upper surface of the molding material layer 127 and the upper surface of the interposer underfill layer 126 may constitute at least a portion of the uppermost surface of the interposer module 120. In this case, the molding material layer 127 together with the interposer underfill layer 126 may constitute the high CTE region 120*a* of the interposer module 120. Alternatively, the upper surface of the interposer underfill layer 126 may be below the uppermost surface of the interposer module 120. In such an embodiment, the molding material layer 127 may be formed on the upper surface of the interposer underfill layer 126.

The upper surface of the molding material layer 127 and the upper surface of the interposer underfill layer 126 may also be substantially co-planar with an upper surface of the primary semiconductor devices 123*a*-123*d* and an upper surface of the secondary semiconductor devices 124*a*-124*h*.

In this case, the uppermost surface of the interposer module 120 may be constituted by the upper surface of the molding material layer 127, the upper surface of the interposer underfill layer 126, the upper surface of the primary semiconductor devices 123*a*-123*d*, and the upper surface of the secondary semiconductor devices 124*a*-124*h*.

The TIM film 140 may be formed on the interposer module 120 to dissipate of heat generated during operation of the package assembly 100 (e.g., operation of the primary semiconductor devices 123*a*-123*d* and the secondary semiconductor devices 124*a*-124*h*). The TIM film 140 may be attached to the interposer module 120, for example, by a thermally conductive adhesive. In at least one embodiment, the TIM film 140 may contact an upper surface of the primary semiconductor devices 123*a*-123*d*, an upper surface of the secondary semiconductor devices 124*a*-124*h*, and an upper surface of the molding material layer 127 and/or an upper surface of the interposer underfill layer 126. The TIM film 140 may have a low bulk thermal impedance and high thermal conductivity. The bond-line-thickness (BLT) (e.g., a distance between the package lid 130 and the interposer module 120) may be less than about 100 μm, although greater or lesser distances may be used.

The package assembly 100 may also include a stiffener ring (not shown) that may be fixed to the package substrate 110 by an adhesive (e.g., a silicone adhesive or an epoxy adhesive). The stiffener ring may be formed of a metal such as copper with a nickel coating, or an aluminum alloy. The stiffener ring may be formed on the chip-side surface of the package substrate 110 so as to encircle the interposer module 120. The stiffener ring may help provide rigidity to the package substrate 110.

The package lid 130 may be on the TIM film 140 and may provide a cover for the interposer module 120. The package lid 130 may contact at least a portion of the TIM film 140. In one or more embodiments, the package lid 130 may directly contact an entire upper surface of the TIM film 140. In one or more embodiments, the TIM film 140 may be compressed between the package lid 130 and the uppermost surface of the interposer module 120.

The inner lid 132 of the package lid 130 may have a shape designed to cover at least part of the high CTE region 120*a* of the interposer module 120 (e.g., in the z-direction). In at least one embodiment, the inner lid 132 may be designed to cover a portion of the high CTE region 120*a* that is most susceptible to the risk of crack and delamination. The outer lid 131 may be located outside the inner lid 132 and cover both the inner lid 132 and the interposer module 120. The outer lid 131 may have a bottom surface having a shape designed to cover a region of the interposer module 120 that is outside the high CTE region 120*a* (e.g., in the z-direction). In at least one embodiment, the outer lid 131 may include an outer lid material having a first CTE, and the inner lid 132 may include an inner lid material having a second CTE less than the first CTE.

The outer lid 131 may be formed, for example, of metal, ceramic or polymer material. In particular, the outer lid material may have a CTE that is greater than or equal to 10 ppm/° C. In at least one embodiment, the outer lid material may have a CTE of about 17 ppm/° C. or more, such as a stainless steel with added copper (e.g., SUS304/Cu or SUSXM7). The outer lid 131 may be formed, for example, by milling using a computer numerical control (CNC) milling machine (also referred to as polishing), or by molding, punching or stamping the outer lid 131 to have a desired shape.

The outer lid 131 may include an outer lid plate portion 131*d* that may cover the interposer module 120. A bottom surface of the outer lid plate portion 131*d* may extend across the outer lid plate portion 131*d*. The bottom surface may include an outer lid non-recessed portion 131*d*-NR. The outer lid non-recessed portion 131*d*-NR may include a portion that is located over the interposer module 120. In particular, the outer lid non-recessed portion 131*d*-NR may be located over the primary semiconductor devices 123*a*-123*b* and the secondary semiconductor devices 124*a* and 124*b*. In at least one embodiment, the primary semiconductor devices 123*a*-123*b* and the secondary semiconductor devices 124*a* and 124*b* (e.g., the region outside the high CTE region 120*a*) may be covered exclusively by the outer lid non-recessed portion 131*d*-NR. As illustrated in FIG. 1B, the outer lid non-recessed portion 131*d*-NR may also be located over a portion of the high CTE region 120*a* that is between each of the primary semiconductor devices 123*a*-123*d*, and between the primary semiconductor devices 123*a*-123*d* and secondary semiconductor devices 124*a*-124*h*. In at least one embodiment, the outer lid non-recessed portion 131*d*-NR may cover a portion of the high CTE region 120 that has a relatively low risk of crack and delamination, and the inner lid 132 may cover a portion of the high CTE region 120 that has a relatively high risk of crack and delamination.

The outer lid non-recessed portion 131*d*-NR may contact the TIM film 140. At least a portion of the TIM film 140 may be compressed between the outer lid non-recessed portion 131*d*-NR and the uppermost surface of the interposer module 120. The outer lid non-recessed portion 131*d*-NR may also include a portion that is located outside the inner lid 132 (e.g., in the y-direction).

The bottom surface of the outer lid plate portion 131*d* may also include an outer lid recessed portion 131*d*-R. The outer lid non-recessed portion 131*d*-NR may project from the outer lid recessed portion 131*d*-R in the z-direction toward the interposer module 120 and toward the package substrate 110. The outer lid recessed portion 131*d*-R may be located over at least part of the high CTE region 120*a* of the interposer module 120. For example, the outer lid recessed portion 131*d*-R may be located over at least part of the molding material layer 127 and/or the interposer underfill layer 126.

At the outer lid recessed portion 131*d*-R, the outer lid plate portion 131*d* may have a first height H1 (e.g., thickness in the z-direction). At the outer lid non-recessed portion 131*d*-NR, the outer lid plate portion 131*d* may have a height H1' (e.g., thickness in the z-direction). The height H1' of the outer lid plate portion 131*d* may be greater than the first height H1 of the outer lid plate portion 131*d* by a height (e.g., thickness in the z-direction) of the outer lid non-recessed portion 131*d*-NR.

The outer lid 131 may also include an outer foot 131*a* that projects from the outer lid plate portion 131*d* in the z-direction. The outer foot 131*a* may project substantially perpendicularly from the outer lid plate portion 131*d*. As illustrated in FIG. 1B, the outer foot 131*a* may project from the outer lid non-recessed portion 131*d*-NR of the outer lid plate portion 131*d*. The outer foot 131*a* may project from the outer lid plate portion 131*d* at an outermost part of the outer lid plate portion 131*d*. In at least one embodiment, a sidewall of the outer foot 131*a* may be substantially aligned in the z-direction with a sidewall of the outer lid plate portion 131*d*.

The outer foot 131*a* may be attached to the package substrate 110 at the outer lid attachment portion 110$_{131}$ of the package substrate 110. The outer foot 131*a* may be attached to the package substrate 110 by an adhesive 160*a*. The adhesive 160*a* may include, for example, an epoxy adhesive or silicone adhesive. Other adhesives are within the contemplated scope of this disclosure.

The inner lid 132 may include an inner lid material having a second CTE (e.g., ultra-low CTE) that is less than 3 ppm/° C. (i.e., $3 \times 10^{-6}$ °C.$^{-1}$). The inner lid material may include, for example, a nickel-iron, low-expansion alloy containing 36% nickel (e.g., INVAR36). The inner lid 132 may be designed to cover a high CTE material (e.g., polymer material; COW polymer region) in the interposer module 120 and mitigate stress that may exist in a conventional package assembly between the material of the outer lid 131 (e.g., ring) and the high CTE material. Thus, the package lid 130 including the inner lid 132, may help to achieve polymer material stress mitigation (e.g., mitigate polymer material crack and delamination risk) and, thereby increase the reliability of the package assembly 100.

The inner lid 132 may include an inner lid plate portion 132*d* that may be substantially co-planar with the outer lid plate portion 131*d*. The inner lid plate portion 132*d* may be attached to the bottom surface of the outer lid plate portion 131*d*. In particular, the inner lid plate portion 132*d* may be attached to the outer lid recessed portion 131*d*-R in the bottom surface of the outer lid plate portion 131*d*. The inner lid plate portion 132*d* may have a width (e.g., in the y-direction) that is substantially the same as a width (e.g., in the y-direction) of the outer lid recessed portion 131*d*-R.

At least a portion of the inner lid plate portion 132*d* may be formed over the interposer module 120 and the TIM film 140. In at least one embodiment, at least a portion of the TIM film 140 may be compressed between the inner lid plate portion 132*d* and the uppermost surface of the interposer module 120. In particular, the inner lid plate portion 132*d* may cover (e.g., in the z-direction) at least part of the high CTE region 120*a* of the interposer module 120. For example, the inner lid plate portion 132*d* may be located over at least part of the molding material layer 127 and/or the interposer underfill layer 126. In at least one embodiment, the inner lid plate portion 132*d* may cover a portion of the high CTE region 120*a* that is most susceptible to the risk of crack and delamination. In at least one embodiment, the inner lid plate portion 132*d* may cover an entirety of the high CTE region 120*a*. Further, although it is not illustrated in FIG. 1B, it is possible for the inner lid plate portion 132*d* to cover at least a portion of interposer module 120*a* that is outside the high CTE region 120*a* (e.g., at least a portion of the primary semiconductor devices 123*a*-123*d* and/or secondary semiconductor devices 124*a*-124*h*).

As illustrated in FIG. 1B, the inner lid plate portion 132*d* may have a second height H2. The second height H2 of the inner lid plate portion 132*d* may be greater than or less than the first height H1. In at least one embodiment, a ratio (H2/H1) of the second height H2 to the first height H1 may satisfy the following: $3.5 > H2/H1 > 0$. In at least one embodiment, (H2/H1) may satisfy the following: $2 > H2/H1 > 0$. The second height H2 may be substantially the same as a height (e.g., thickness in the z-direction) of the outer lid non-recessed portion 131*d*-NR. A bottom surface of the inner lid plate portion 132*d* may, therefore, be substantially co-planar with a bottom surface of the outer lid non-recessed portion 131*d*-NR. In an embodiment, the second height H2 may be equal to the difference between the height H1' and the first height H1. In other embodiments, the second height H2 may be greater than the difference between the height H1' and the first height H1. In still other embodiments, the second height H2 may be less than the difference between the height H1' and the first height H1.

A central region of the inner lid plate portion 132d may include an opening 132-O and at least a portion of the outer lid non-recessed portion 131d-NR may be inserted into the opening 132-O. The inner lid plate portion 132d may be attached to the outer lid plate portion 131d by a press fitting. The inner lid plate portion 132d may also be bonded to the outer lid plate portion 131d, for example, by an adhesive. The adhesive may include, for example, an epoxy adhesive or silicone adhesive. Other adhesives are within the contemplated scope of this disclosure.

The inner lid 132 may also include an inner foot 132a that projects from the inner lid plate portion 132d in the z-direction. The inner foot 132a may project substantially perpendicularly from the inner lid plate portion 132d. As illustrated in FIG. 1B, the inner foot 132a may project from the inner lid plate portion 132d at an outermost part of the inner lid plate portion 132d. In at least one embodiment, a sidewall of the inner foot 132a may be substantially aligned in the z-direction with a sidewall of the inner lid plate portion 132d.

The inner foot 132a may be attached to the package substrate 110 at the inner lid attachment portion 110$_{132}$ of the package substrate 110. The inner foot 132a may be attached to the package substrate 110 by an adhesive 160b. The adhesive 160b may be the same or different than the adhesive 160a in terms of elastic modulus, tensile strength, coefficient of thermal expansion, etc. The adhesive 160b may include, for example, an epoxy adhesive or silicone adhesive. Other adhesives are within the contemplated scope of this disclosure.

A length in the z-direction of the inner foot 132a may be substantially the same as or different than a length in the z-direction of the outer foot 131a. A thickness in the z-direction of the adhesive 160a may also be substantially the same as or different than a thickness in the z-direction of the adhesive 160b.

The inner foot 132a may extend from the inner lid plate portion 132d inside the outer foot 131a. That is, the inner foot 132a may be located between the outer foot 131a and the interposer module 120 (e.g., in the y-direction). The inner foot 132a may have a width (e.g., in the y-direction) that is substantially the same as or different than a width of the outer foot 131a (e.g., in the y-direction). Each of the inner foot 132a and the outer foot 131a may have a width in a range from 0.5 mm to 10 mm, although greater or lesser widths may be used.

The space S1 may be formed between the inner foot 132a and the interposer module 120. The width of the space S1 (e.g., in the y-direction) may be measured from the inner foot 132a to a nearest part of the interposer module 120, such as an edge of the package underfill 129. The width of the space S1 (e.g., in the y-direction) may be, for example, greater than 1 mm. The space S2 may be formed between the inner foot 132a and the outer foot 131a. The width of the space S2 (e.g., in the y-direction) may be in a range from 1 mm to 100 mm.

Figure 1C:
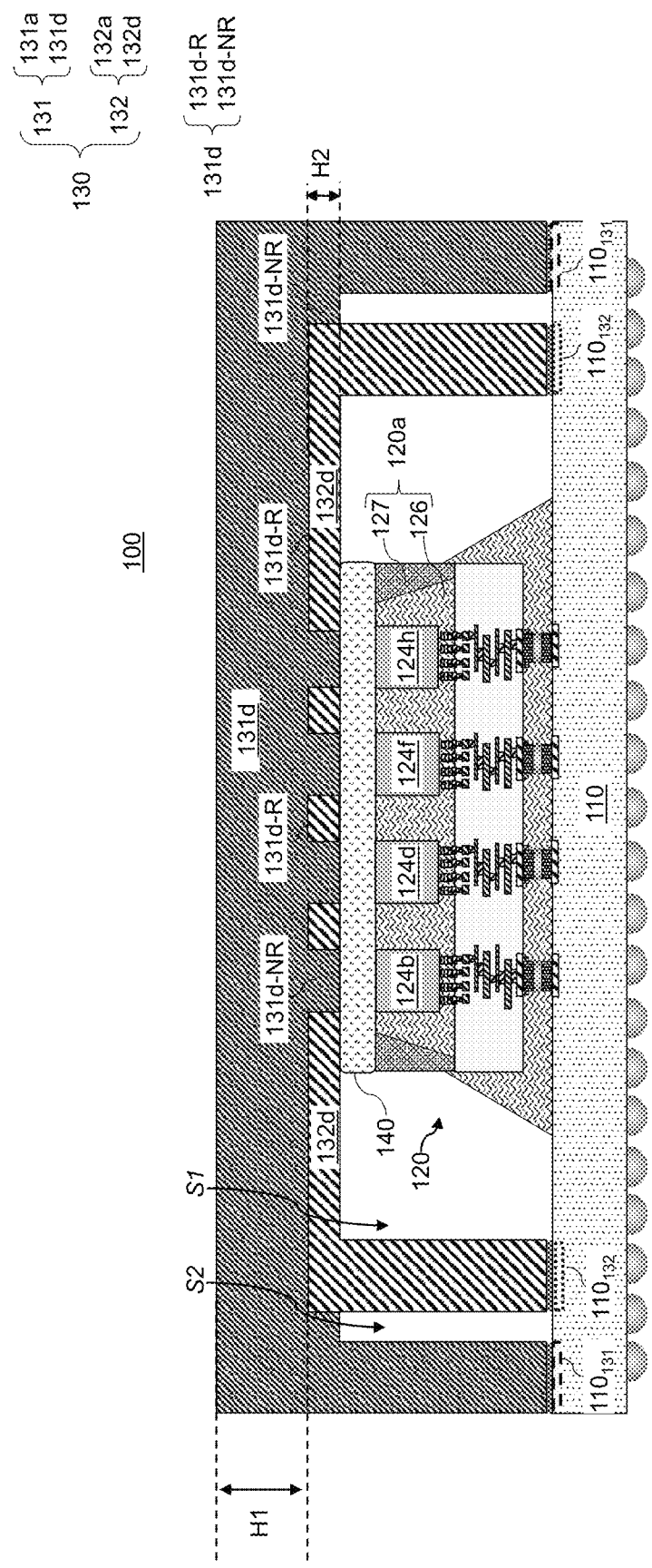
FIG. 1C is a vertical cross-sectional view of the package assembly along lines II-II' in FIG. 1A, according to one or more embodiments.

FIG. 1C is a vertical cross-sectional view of the package assembly 100 according to one or more embodiments. In particular, FIG. 1C is a vertical cross-sectional view along lines II-II' in FIG. 1A.

A configuration of the outer lid plate portion 131d along the vertical cross-sectional view long lines II-II' in FIG. 1C may be different than the configuration along the vertical cross-sectional view along lines I-I' in FIG. 1B. A configuration of the inner lid plate portion 132d along the vertical cross-sectional view long lines II-II' in FIG. 1C may also be different than the configuration along the vertical cross-sectional view along lines I-I' in FIG. 1B. In addition, in contrast to the vertical cross-sectional view long lines I-I' in FIG. 1B which includes the primary semiconductor devices 123a and 123b and secondary semiconductor devices 124a and 124b, the vertical cross-sectional view along lines II-II' in FIG. 1C includes the secondary semiconductor devices 124b, 124d, 124f and 124h.

As illustrated in FIG. 1C, the outer lid recessed portion 131d-R in the bottom surface of the outer lid plate portion 131 may be located over the high CTE region 120a of the interposer module 120. For example, the outer lid recessed portion 131d-R may be located over the molding material layer 127 and the interposer underfill layer 126. The outer lid non-recessed portion 131d-NR in the bottom surface of the outer lid plate portion 131, on the other hand, may be located outside the high CTE region 120a (e.g., in the z-direction). For example, the outer lid non-recessed portion 131d-NR may be located over the secondary semiconductor devices 124b, 124d, 124f and 124h.

The inner lid plate portion 132d may be located in the outer lid recessed portions 131d-R, and may therefore, cover (e.g., in the z-direction) the high CTE region 120a of the interposer module 120. For example, the inner lid plate portion 132d may be located over the molding material layer 127 and the interposer underfill layer 126.

The inner foot 132a may have a width (e.g., in the x-direction) that is substantially the same as or different than a width of the outer foot 131a (e.g., in the x-direction). Each of the inner foot 132a and the outer foot 131a may have a width (e.g., in the x-direction) in a range from 0.5 mm to 10 mm. The width of the space S1 (e.g., in the x-direction) may be, for example, greater than 1 mm. The width of the space S2 (e.g., in the x-direction) may be in a range from 1 mm to 100 mm.

Figure 1D:
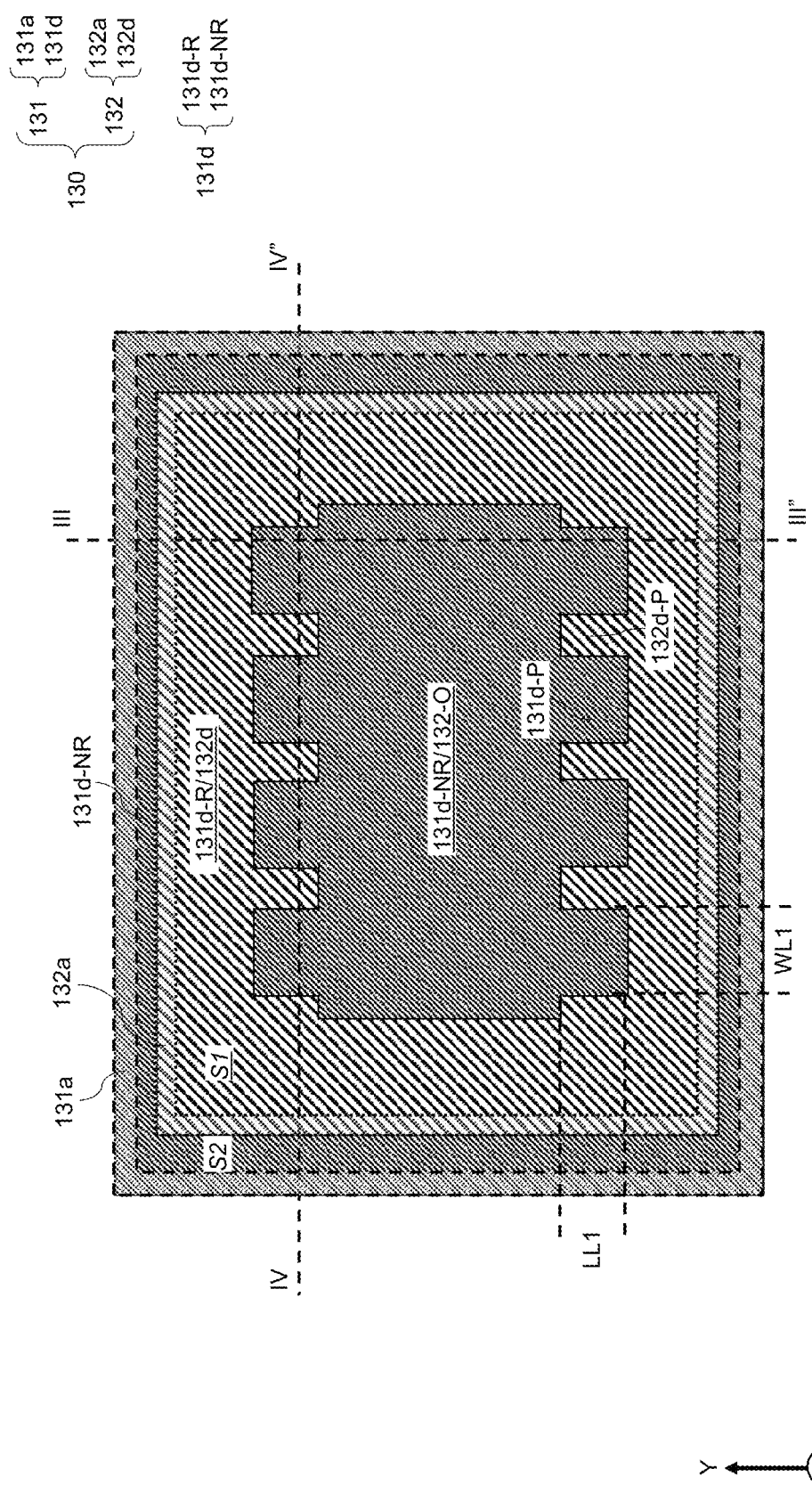
FIG. 1D is a plan view of the package lid (that has been inverted), according to one or more embodiments.

FIG. 1D is a plan view of the package lid 130 (that has been inverted) according to one or more embodiments. The package lid 130 may have a square shape or rectangle shape. Other suitable shapes of the package lid 130 may be within the contemplated scope of disclosure. For example, the package lid 130 may have a circular, oval, hexagonal, octagonal, polygonal shape. It should be noted that FIG. 1B includes a vertical cross-sectional view of the package lid 130 along lines III-III' in FIG. 1D. FIG. 1C includes a vertical cross-sectional view of the package lid 130 along lines IV-IV' in FIG. 1D.

The outer foot 131a may be formed around the entire outer perimeter of the package lid 130. The inner foot 132a may be formed inside the outer foot 131a around the entire perimeter of the package lid 130. The inner foot 132a may be separated from the outer foot 131a by the space S2 around the entire perimeter of the inner foot 132a.

The outer lid non-recessed portion 131d-NR may be located between the outer foot 131a and the inner foot 132a. The outer lid non-recessed portion 131d-NR may also be located in a central region of the outer lid plate portion 131d. The outer lid non-recessed portion 131d-NR may include outwardly projecting portions 131d-P which project outwardly from the outer lid non-recessed portion 131d-NR (e.g., outwardly from the central region of the outer lid plate portion 131d). The outer lid recessed portion 131d-R may be located outside the central region of the outer lid plate portion 131d.

As illustrated in FIG. 1D, the central region of the inner lid plate portion 132d may include the opening 132-O and at least a portion of the outer lid non-recessed portion 131*d*-NR may be inserted into the opening O. In at least one embodiment, the opening 132-O may be co-extensive the outer lid non-recessed portion 131*d*-NR.

The outwardly projecting portions 131*d*-P of the outer lid non-recessed portion 131*d*-NR may have a size and shape that corresponds substantially to a size and shape of the secondary semiconductor devices 124*a*-124*h* (e.g., see FIG. 1A). In particular, the outwardly projecting portions 131*d*-P may have a width WL1 in the x-direction and a length LL1 in the y-direction. In at least one embodiment, the width WD1 of the secondary semiconductor devices 124*a*-124*h* may be greater than or equal to a width WL1 of the outwardly projecting portions 131*d*-P which may be greater than zero. In at least one embodiment, the length LD1 of the secondary semiconductor devices 124*a*-124*h* may be greater than or equal to the length LL1 of the outwardly projecting portions 131*d*-P which is greater than zero.

An advantage of the package lid 130 is that the number, size, shape and/or arrangement of the outwardly-projecting portions 131*d*-P may be changed in order to accommodate different numbers, sizes, shapes and/or arrangements of the secondary semiconductor devices 124*a*-124*h* in the interposer module 120. Thus, for example, the width WL1 and length LL1 of the outwardly projecting portions 131*d*-P may be increased to accommodate larger secondary semiconductor devices, the number of the outwardly projecting portions 131*d*-P may be reduced to accommodate fewer secondary semiconductor devices, and so on.

The inner lid plate portion 132*d* may be co-extensive with the outer lid recessed portion 131*d*-R. The inner lid plate portion 132*d* may include inwardly projecting portions 132*d*-P which project inwardly into the opening 132-O in the inner lid plate portion 132*d* (e.g., toward the central region of the outer lid plate portion 131*d*). The inwardly-projecting portions 132*d*-P may have a size and shape corresponding to a spacing between the plurality of secondary semiconductor devices 124*a*-124*h*. As illustrated in FIG. 1D, the outwardly projecting portions 131*d*-P of the outer lid non-recessed portion 131*d*-NR may have an interdigitated arrangement with the inwardly projecting portions 132*d*-P of the inner lid plate portion 132*d*.

Figure 2A:
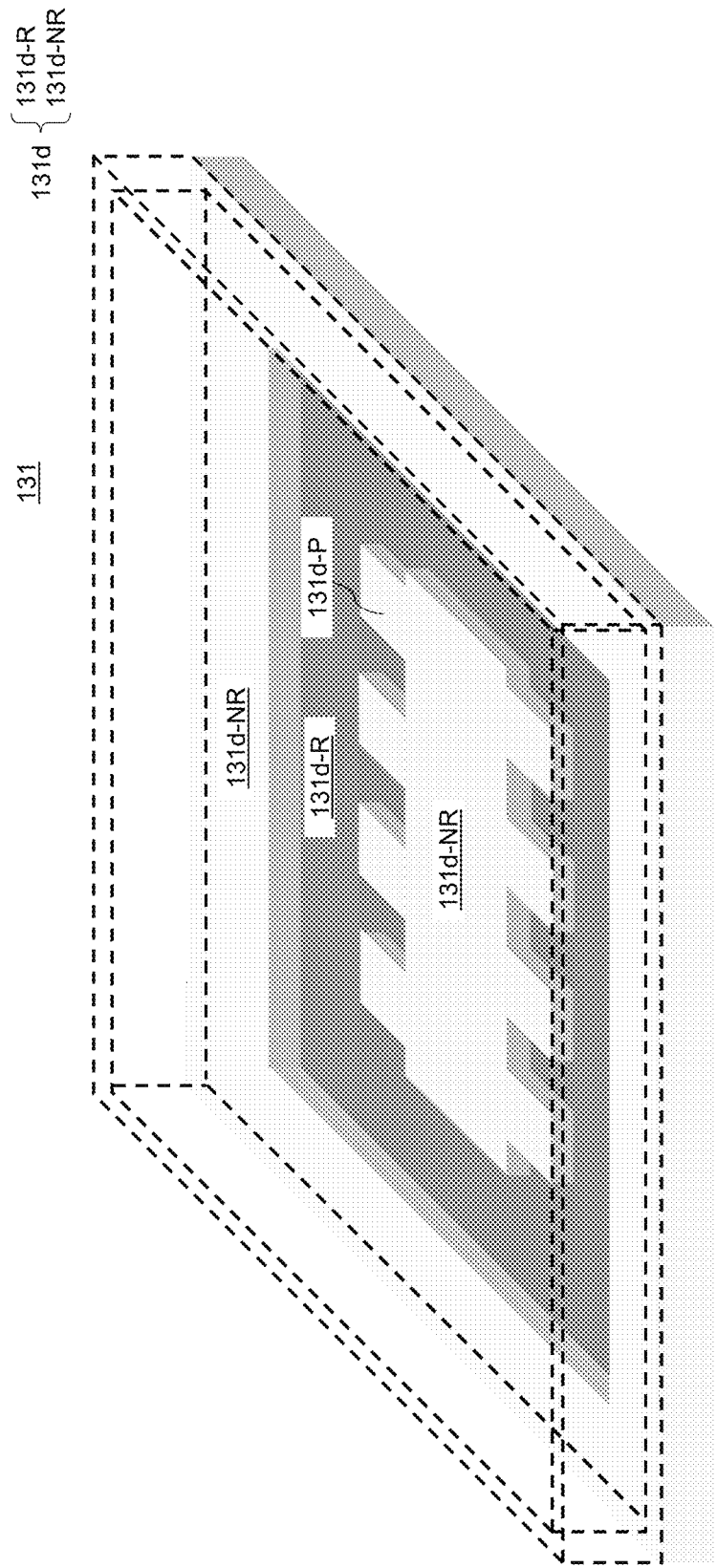
FIG. 2A is a perspective view of the outer lid, according to one more embodiments.

FIGS. 2A-2D illustrate various steps in forming the package lid 130, according to one or more embodiments. In particular, FIG. 2A is a perspective view of the outer lid 131, according to one more embodiments. For ease of explanation, the outer foot 131*a* of the outer lid 131 is not shown in FIG. 2A, but an outline of the outer foot 131*a* is indicated by dashed lines. The outer lid 131 may be formed by milling using a CNC milling machine or by molding, punching or stamping the outer lid 131.

In particular, FIG. 2A illustrates the bottom surface of the outer lid plate portion 131*d*. As illustrated in FIG. 2A, at least a portion of the outer lid non-recessed portion 131*d*-NR may be located in the central region of the outer lid plate portion 131*d*. The outer lid recessed portion 131*d*-R may be formed outside the outer lid non-recessed portion 131*d*-NR. The outwardly projecting portions 131*d*-P may project outwardly from the outer lid non-recessed portion 131*d*-NR toward the outer lid recessed portion 131*d*-R. The outer lid non-recessed portion 131*d*-NR may also include a portion that is outside the outer lid recessed portion 131*d*-R.

Figure 2B:
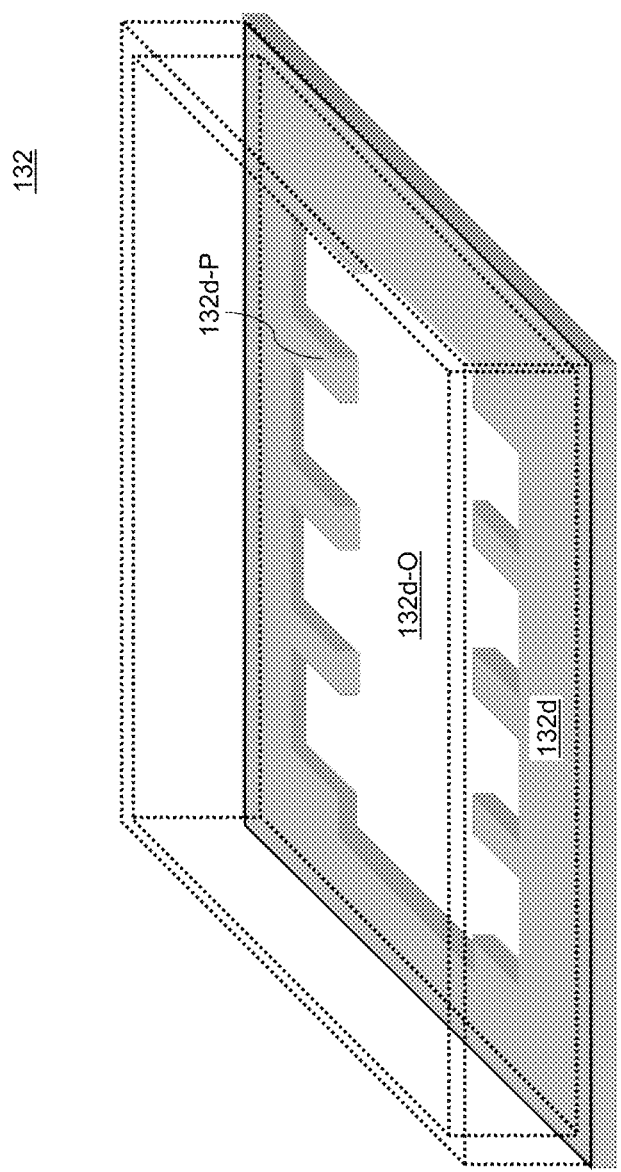
FIG. 2B is a perspective view of the inner lid, according to one more embodiments.

FIG. 2B is a perspective view of the inner lid 132, according to one more embodiments. For ease of explanation, the inner foot 132*a* of the inner lid 132 is not shown in FIG. 2B, but an outline of the inner foot 132*a* is indicated by dotted lines. The inner lid 132 may be formed by milling using a CNC milling machine or by molding, punching or stamping the inner lid 132. As illustrated in FIG. 2B, the opening 132*d*-O may be formed in a central region of the inner lid plate portion 132*d*. The opening 132*d*-O may have a shape corresponding to a shape of the outer lid non-recessed portion 131*d*-NR. The inwardly projecting portions 132*d*-P of the inner lid plate portion 132 may project inwardly into the opening 132*d*-O.

Figure 2C:
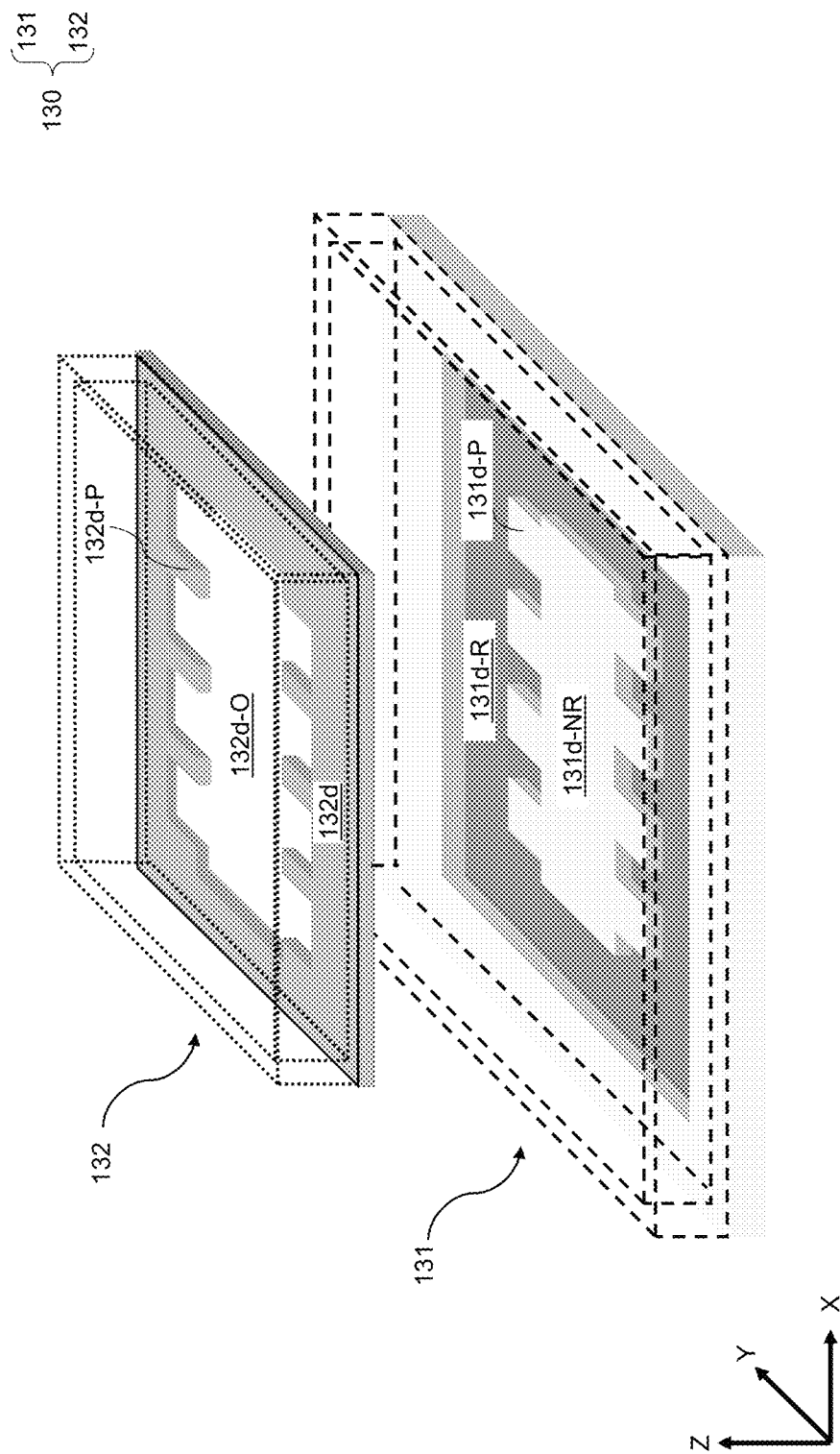
FIG. 2C illustrates an alignment of the outer lid and the inner lid in a method of forming the package lid, according to one or more embodiments.

FIG. 2C illustrates an alignment of the outer lid 131 and the inner lid 132 in a method of forming the package lid 130, according to one more embodiments. As illustrated in FIG. 2C, after the forming of the outer lid 131 (see FIG. 2A) and the forming of the inner lid 132 (see FIG. 2B), the inner lid 132 may be located over and aligned with the outer foot 131*a*. In particular, the opening 132*d*-O in the inner foot 132*a* may be aligned (e.g., in the z-direction) with the outer lid non-recessed portion 131*d*-NR. The inner lid plate portion 132*d* may also be aligned (e.g., in the z-direction) with the outer lid recessed portion 131*d*-R. Although it is not shown in FIG. 2C, an adhesive (e.g., epoxy adhesive or silicone adhesive) may be applied to the outer lid recessed portion 131*d*-R and/or to an upper surface of the inner lid plate portion 132*d* (e.g., the surface facing the outer lid recessed portion 131*d*-R).

Figure 2D:
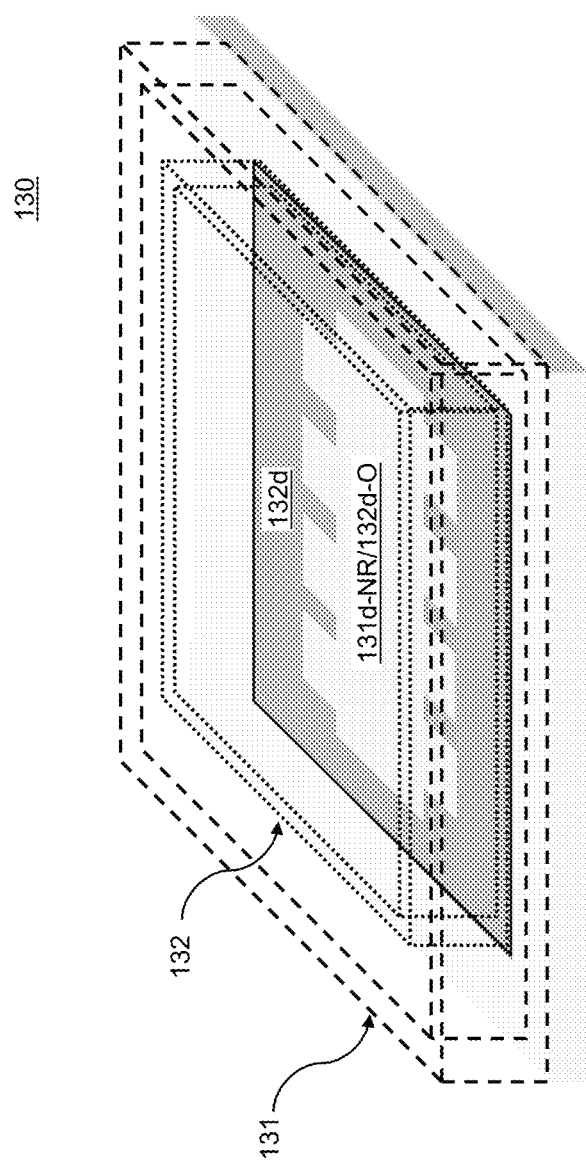
FIG. 2D illustrates the assembled package lid including the outer lid and the inner lid, according to one more embodiments.

FIG. 2D illustrates the assembled package lid 130 including the outer lid 131 and the inner lid 132, according to one more embodiments. As illustrated in FIG. 2D, after the outer lid 131 and inner lid 132 are aligned, the inner lid 132 may be attached to the outer lid 131. In particular, the inner lid plate portion 132*d* may be pressed into the outer lid recessed portion 131*d*-R. The outer lid non-recessed portion 131*d*-NR in the central region of the outer lid plate portion 131*d* may be inserted into the opening 132*d*-O in the inner lid plate portion 132*d*.

After the package lid 130 is assembled, a bottom surface of the package lid 130 may be constituted by a combination of the outer lid non-recessed portion 131*d*-NR and the inner lid plate portion 132*d*. After the adhesive securing the inner lid 132 to the outer lid 131 has cured, the bottom surface of the package lid 130 may be polished. The polishing may remove any excess adhesive on the bottom surface of the package lid 130. The polishing may also planarize the bottom surface of the package lid 130.

Figure 3A:
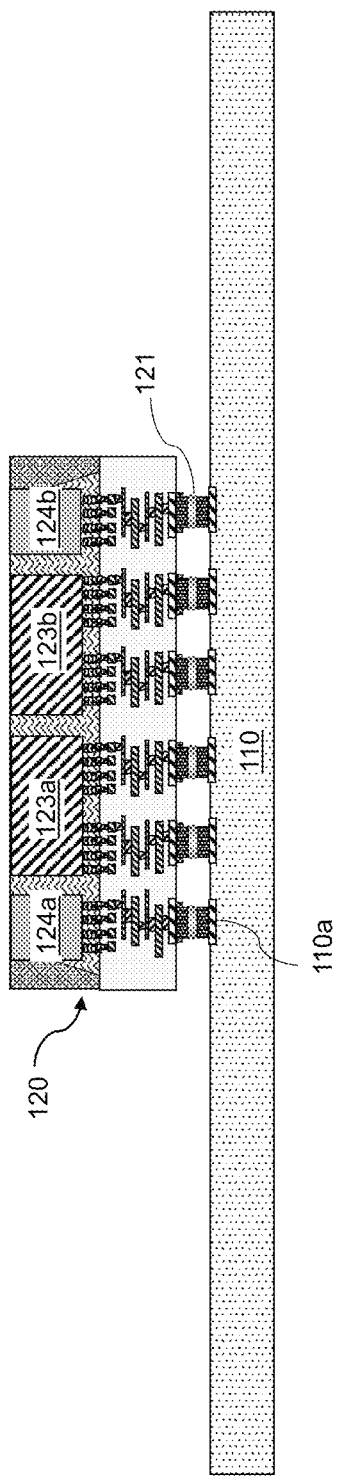
FIG. 3A is a vertical cross-sectional view of an intermediate structure in which the interposer module may be mounted on the package substrate (e.g., via a flip chip bonding (FCB) process), according to one or more embodiments.

FIGS. 3A-3K illustrate various intermediate structures that may be formed during a method of making the package assembly 100 according to one or more embodiments. FIG. 3A is a vertical cross-sectional view of an intermediate structure in which the interposer module 120 may be mounted on the package substrate 110 (e.g., via a flip chip bonding (FCB) process) according to one or more embodiments. As illustrated in FIG. 3A, the first interconnect structures 121 of the interposer module 120 may be positioned on the metal bonding pads 110*a* of the package substrate 110 and heated in order to bond the first interconnect structures 121 to the metal bonding pads 110*a*.

Figure 3B:
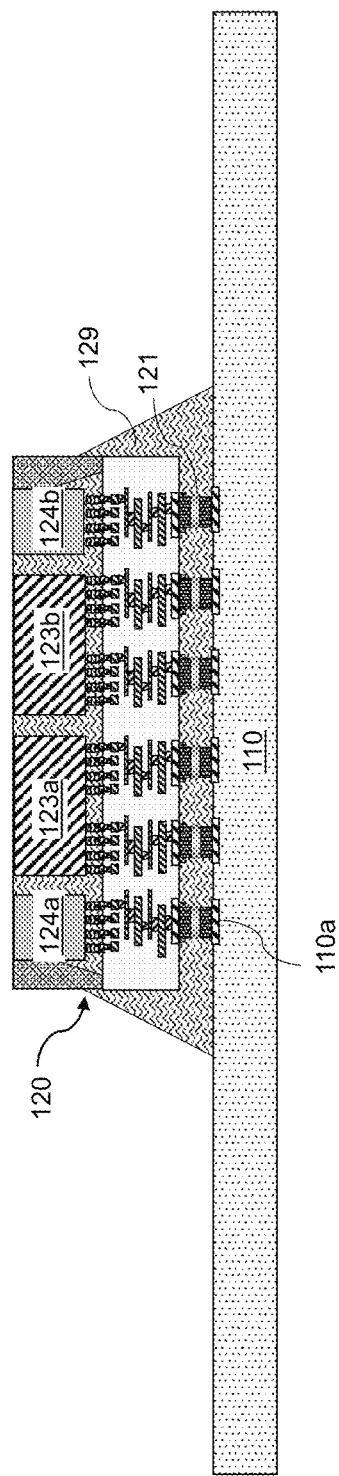
FIG. 3B is a vertical cross-sectional view of an intermediate structure in which the package underfill layer may be formed on the package substrate, according to one or more embodiments.

FIG. 3B is a vertical cross-sectional view of an intermediate structure in which the package underfill layer 129 may be formed on the package substrate 110 according to one or more embodiments. The package underfill layer 129 may be formed of an epoxy-based polymeric material. As illustrated in FIG. 3B, the package underfill layer 129 may be formed under and around the interposer module 120 and the first interconnect structures 121 so as to fix the interposer module 120 to the package substrate 110. The package underfill layer 129 may then be cured, for example, in a box oven for about 90 minutes at about 150° C. to provide the package underfill layer 129 with a sufficient stiffness and mechanical strength.

Figure 3C:
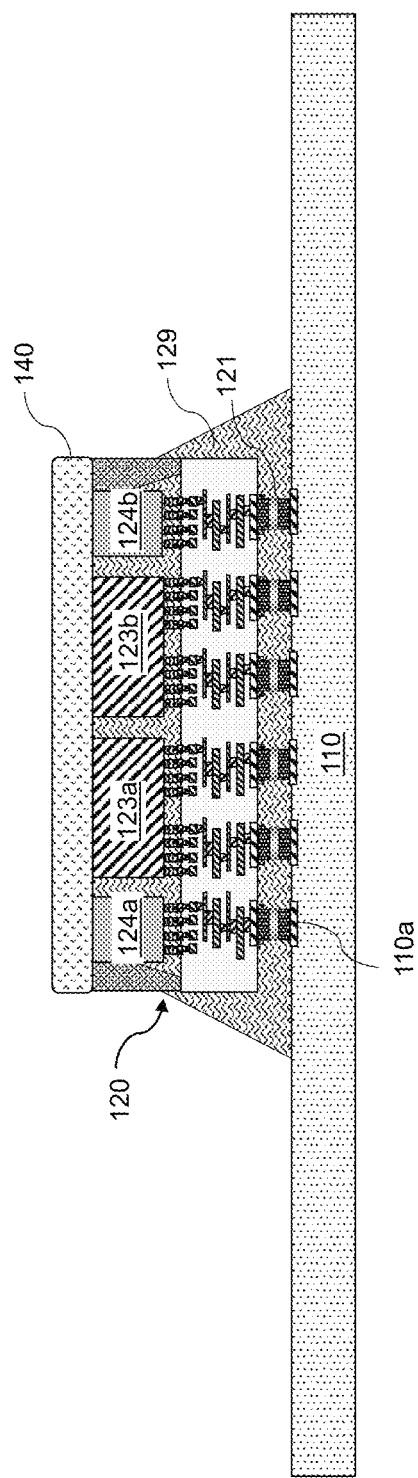
FIG. 3C is a vertical cross-sectional view of an intermediate structure in which the TIM film may be formed on (e.g., dispensed on) or attached to the upper surface of the interposer module, according to one or more embodiments.

FIG. 3C is a vertical cross-sectional view of an intermediate structure in which the TIM film 140 may be formed on (e.g., dispensed on) or attached to the upper surface of the interposer module 120 according to one or more embodiments. The TIM film 140 may include, for example, a thermal paste, thermal adhesive, thermal gap filler, thermal pad (e.g., silicone), thermal tape, a graphite TIM film, a carbon nanotube TIM film or a gel TIM (e.g., a cross-linked polymer film). The TIM film 140 may be attached to the upper surface of the interposer module 120 by using, for example, a thermally conductive adhesive.

Figure 3D:
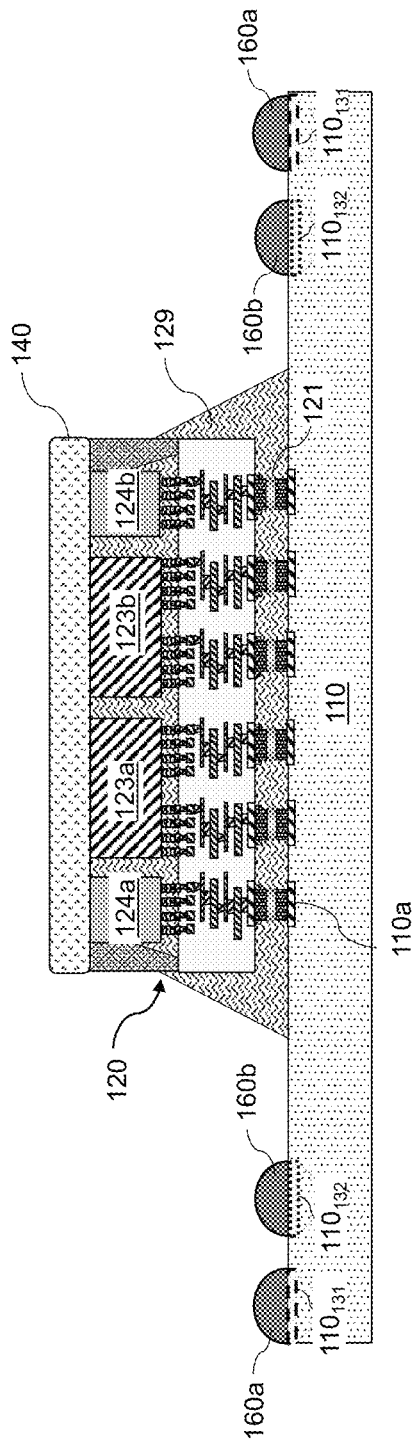
FIG. 3D illustrates a vertical cross-sectional view of an intermediate structure in which the adhesive may be applied to the package substrate, according to one or more embodiments.

FIG. 3D illustrates a vertical cross-sectional view of an intermediate structure in which the adhesive 160a and adhesive 160b may be applied to the package substrate 110 according to one or more embodiments. In particular, the adhesive 160a may be applied to the outer lid attachment portion $110_{131}$ (shown by dashed lines) where the outer lid 131 is to be attached to the package substrate 110. The adhesive 160b may be applied to the inner lid attachment portion $110_{132}$ (shown by dotted lines) where the inner lid 132 is to be attached to the package substrate 110.

The adhesive 160a and adhesive 160b may include, for example, a silicone adhesive or an epoxy adhesive. The adhesive 160a may be applied in a quantity sufficient to securely bond the outer lid 131 to the package substrate 110. The adhesive 160b may be applied in a quantity sufficient to securely bond the inner lid 132 to the package substrate 110. The dispensed width of the adhesive 160a may be less than the ultimate width of the adhesive 160a (after pressing the outer foot 131a onto the adhesive 160a). The dispensed thickness of the adhesive 160a may be greater than the ultimate thickness of the adhesive 160a (after pressing the outer foot 131a onto the adhesive 160a). The dispensed width of the adhesive 160b may be less than the ultimate width of the adhesive 160b (after pressing the inner foot 132a onto the adhesive 160b). The dispensed thickness of the adhesive 160b may be greater than the ultimate thickness of the adhesive 160b (after pressing the inner foot 132a onto the adhesive 160b).

In particular, a first bead of adhesive material may be formed continuously in a shape and location corresponding to a shape and location of the outer foot 131a of the package lid 130, so as to form the adhesive 160a. A second bead of the adhesive material may be formed continuously in a shape and location corresponding to a shape and location of the inner foot 132a of the package lid 130, so as to form the adhesive 160b. The second bead of adhesive material may be dispensed in a quantity that is substantially the same as the quantity of the first bead.

Figure 3E:
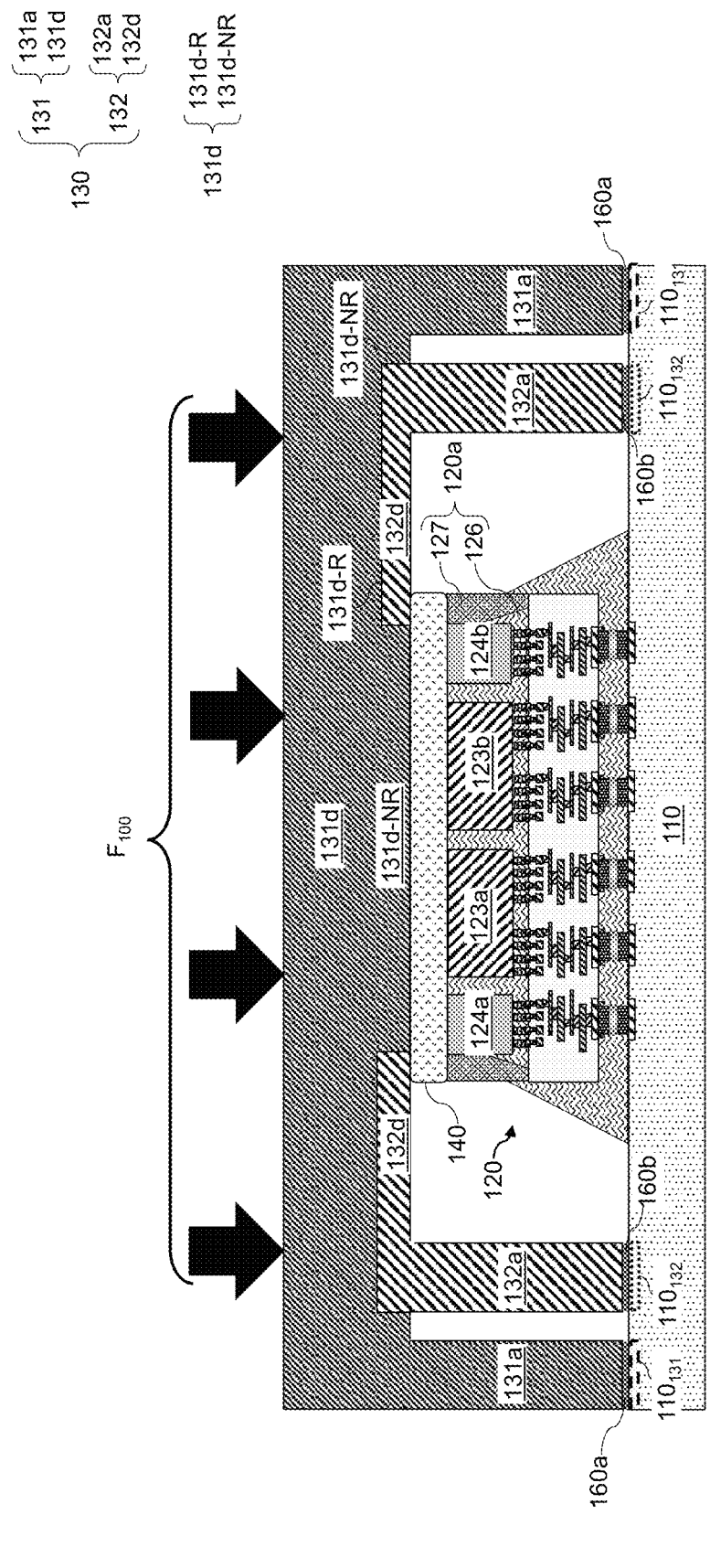
FIG. 3E illustrates a vertical cross-sectional view of an intermediate structure in which the package lid may be attached to (e.g., mounted on) the package substrate, according to one or more embodiments.

FIG. 3E illustrates a vertical cross-sectional view of an intermediate structure in which the package lid 130 may be attached to (e.g., mounted on) the package substrate 110 according to one or more embodiments. The package lid 130 may be formed, for example, as described above with respect to FIGS. 2A-2D.

As illustrated in FIG. 3E, the package substrate 110 with the interposer module 120 may be placed on a surface and the package lid 130 lowered down over the interposer module 120 and onto the package substrate 110. The central region of the outer lid plate portion 132d may be substantially aligned (e.g., in the z-direction) with the central region of the interposer module 120. The outer foot 131a of the outer lid 131 may also be aligned with the adhesive 160a on the outer lid attachment portion $110_{131}$ of the package substrate 110. The inner foot 132a of the inner lid 132 may also be aligned with the adhesive 160b on the inner lid attachment portion $110_{132}$ of the package substrate 110.

A pressing force $F_{100}$ may then be applied to the outer lid plate portion 132d in a downward direction (e.g., the z-direction in FIG. 3E) toward the package substrate 110. The package lid 130 may then be pressed downward so that the outer foot 131a and inner foot 132a of the package lid 130 may contact the package substrate 110 through the adhesive 160a, 160b. The pressing force $F_{100}$ may cause the TIM film 140 to be compressed between the package lid 130 and the uppermost surface of the interposer module 120. In particular, the pressing force F100 may cause the TIM film 140 to be compressed between the uppermost surface of the interposer module 120 (e.g., at the bottom) and the outer lid non-recessed portion 131d-NR and inner lid plate portion 132d (e.g., at the top).

Alternatively, the package lid 130 may be inverted (e.g., flipped) and placed on a surface (e.g., a flat surface), and the interposer module 120 on the package substrate 110 may be inverted and inserted into the package lid 130. The package substrate 110 and interposer module 120 may then be pressed by applying a pressing force down into the package lid 130 so that the outer foot 131a and inner foot 132a of the package lid 130 may contact the package substrate 110 through the adhesive 160a and the adhesive 160b, respectively.

The package lid 130 may then be clamped to the package substrate 110 for a period to allow the adhesive 160a and adhesive 160b to cure and form a secure bond between the package substrate 110 and the package lid 130. In at least one embodiment, the adhesive may be hot press cured at a curing temperature in a range from 100° C.-180° C. The clamping of the package lid 130 to the package substrate 110 may be performed, for example, by using a heat clamp module. The heat clamp module may apply a uniform force across the upper surface of the package lid 130. In one or more embodiments, the heat clamp module may apply the pressing force F100 to the package lid 130.

Figure 3F:
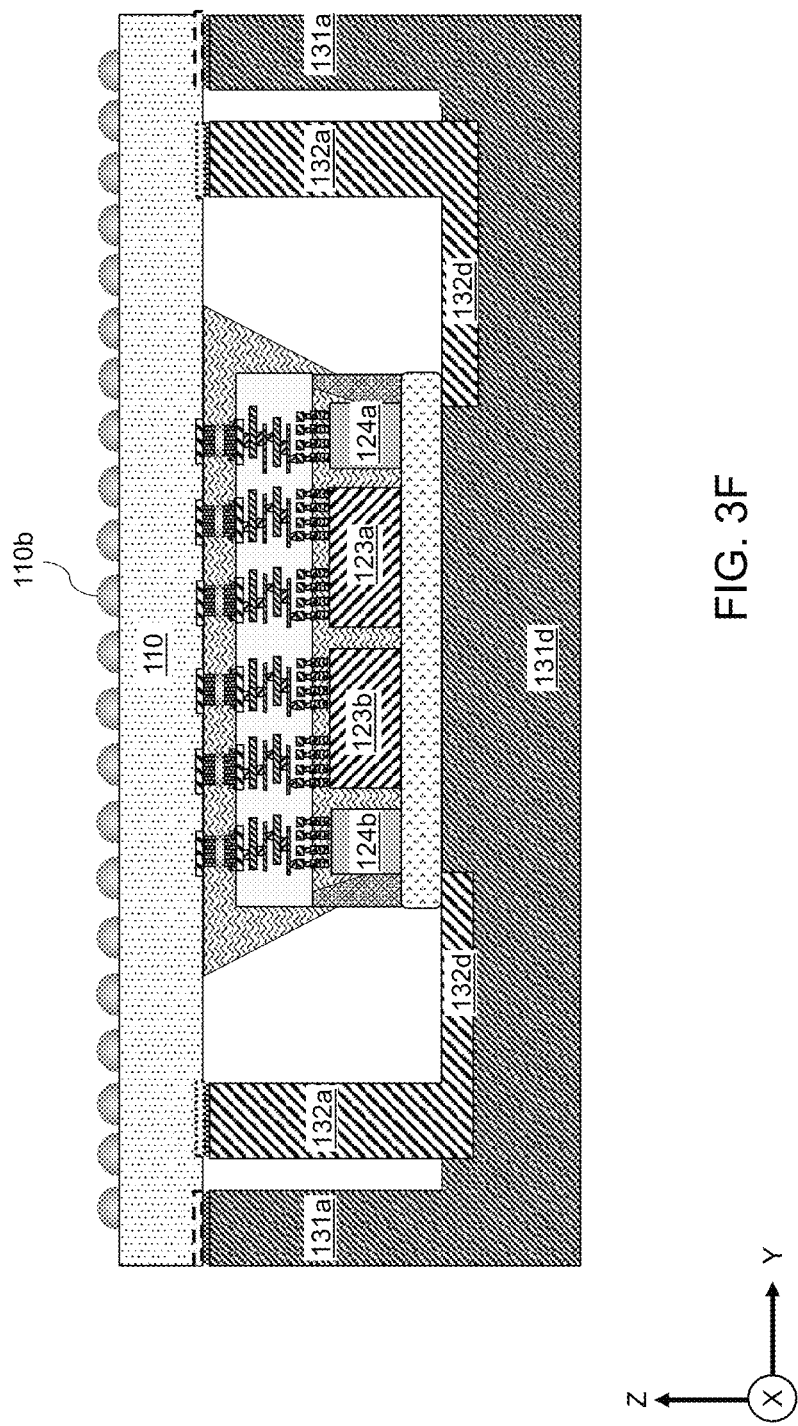
FIG. 3F illustrates a vertical cross-sectional view of an intermediate structure in which a plurality of solder balls may be formed on a board-side surface of the package substrate, according to one or more embodiments.

FIG. 3F illustrates a vertical cross-sectional view of an intermediate structure in which a plurality of solder balls 110b may be formed on a board-side surface of the package substrate 110 according to one or more embodiments. The plurality of solder balls 110b may constitute a ball-grid array (BGA) that may allow the package assembly 100 to be securely mounted (e.g., by surface mount technology (SMT)) on a substrate such as a printed circuit board and electrically coupled to the substrate.

Figure 4:
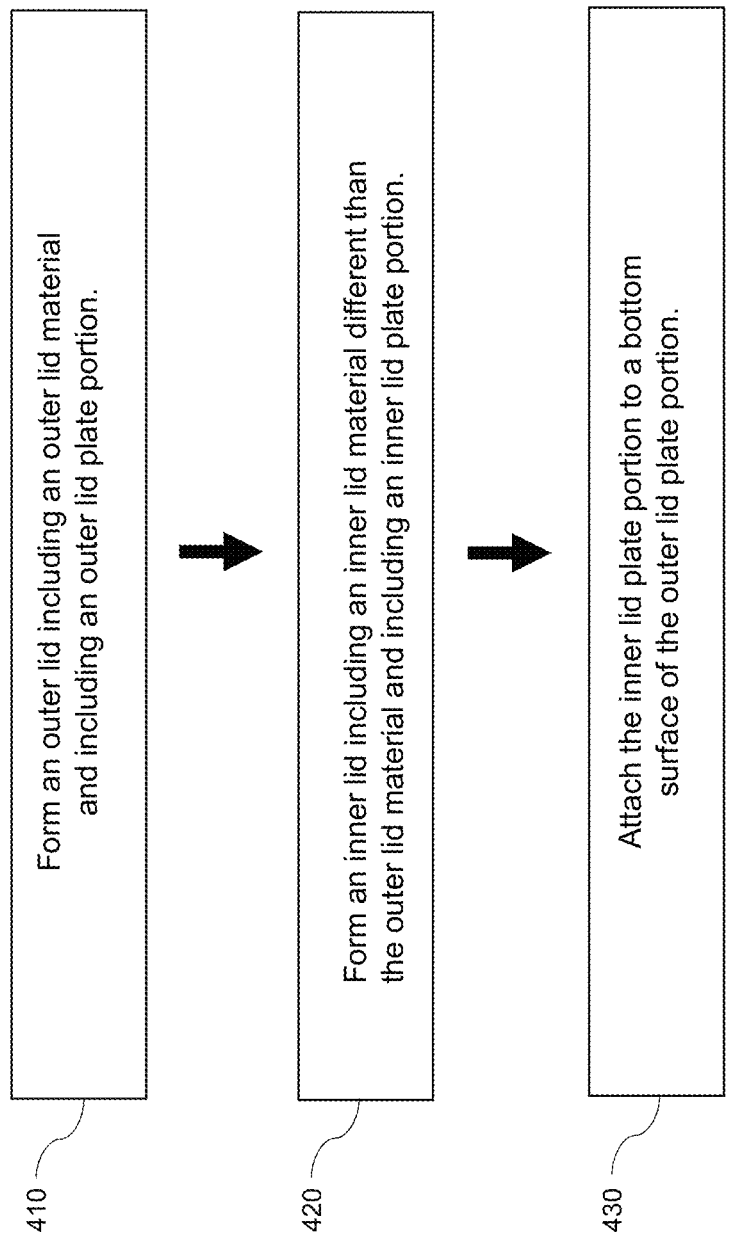
FIG. 4 is a flow chart illustrating a method of making a package lid, according to one or more embodiments.

FIG. 4 is a flow chart illustrating a method of making a package lid according to one or more embodiments. Step 410 includes forming an outer lid including an outer lid material and including an outer lid plate portion. Step 420 includes forming an inner lid including an inner lid material different than the outer lid material and including an inner lid plate portion. Step 430 includes attaching the inner lid plate portion to a bottom surface of the outer lid plate portion.

Figure 5:
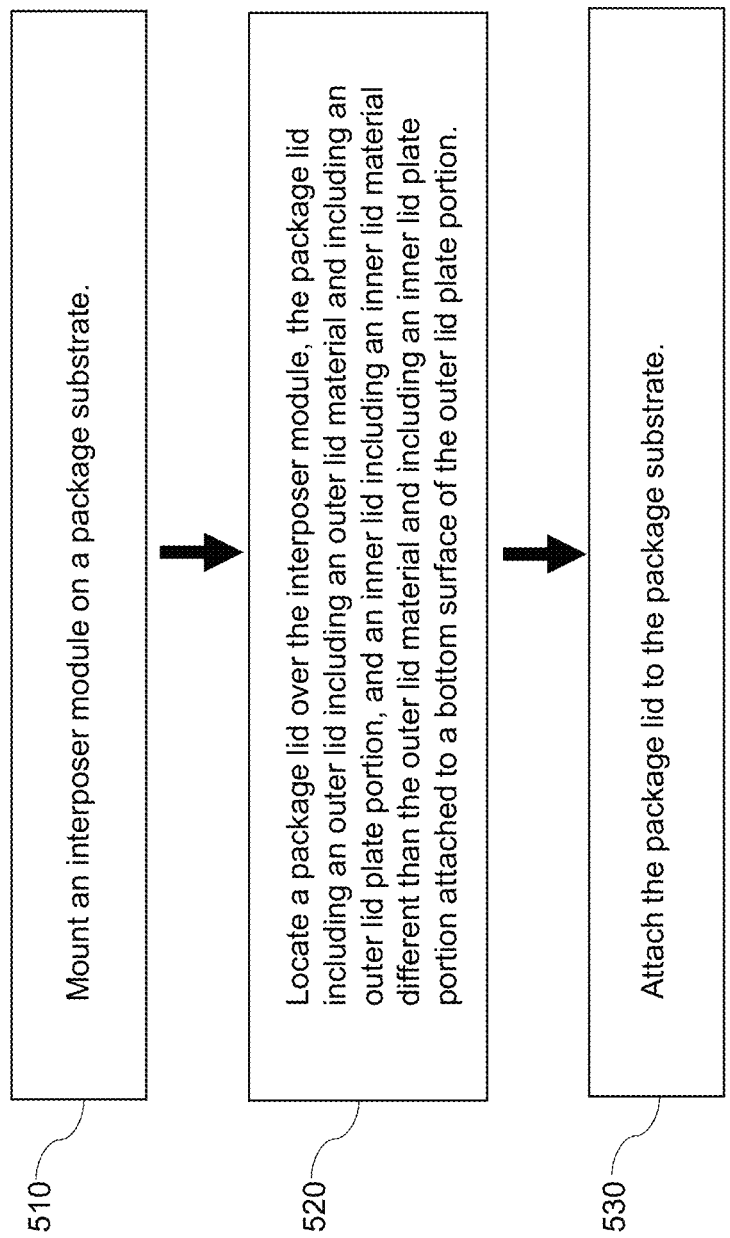
FIG. 5 is a flow chart illustrating a method of making a package assembly, according to one or more embodiments.

FIG. 5 is a flow chart illustrating a method of making a package assembly according to one or more embodiments. Step 510 includes mounting an interposer module on a package substrate. Step 520 includes locating a package lid over the interposer module, the package lid including an outer lid including an outer lid material and including an outer lid plate portion, and an inner lid including an inner lid material different than the outer lid material and including an inner lid plate portion attached to a bottom surface of the outer lid plate portion. Step 530 includes attaching the package lid to the package substrate.

Figure 6:
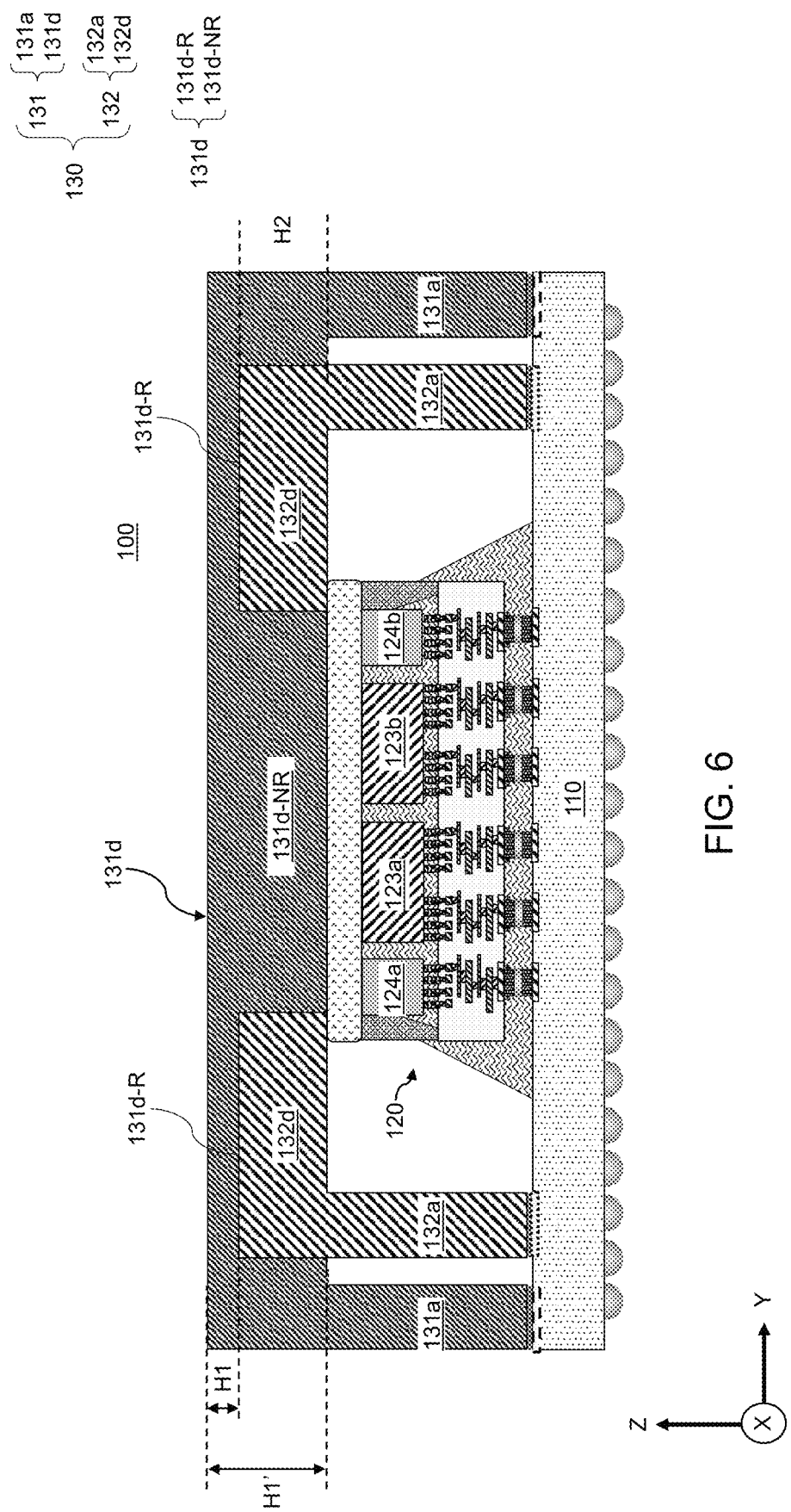
FIG. 6 is a vertical cross-sectional view of an alternative design of the package assembly, according to one or more embodiments.

FIG. 6 is a vertical cross-sectional view of an alternative design of the package assembly 100, according to one or more embodiments. In particular, FIG. 6 is a vertical cross-sectional view of the alternative design along lines I-I' in FIG. 1A, and therefore, FIG. 6 may be similar to FIG. 1B.

In the alternative design of FIG. 6, at the outer lid recessed portion 131*d*-R, the outer lid plate portion 131*d* may have a first height H1. At the outer lid non-recessed portion 131*d*-NR, the outer lid plate portion 131*d* may have a height H1'. The inner lid plate portion 132*d* may have a second height H2 that is greater than a height H1 of the outer lid plate portion 131*d* at the outer lid recessed portion 131*d*-R. In at least one embodiment, the ratio (H2/H1) of the second height H2 to the first height H1 may satisfy the following: 3.5>H2/H1>1. In at least one embodiment, the ratio (H2/H1) may satisfy the following: 3.5>H2/H1>2.

As a thickness of the inner lid plate portion 132*d* increases, a stress on the high CTE region 120*a* of the interposer module 120 may decrease. Thus, an advantage of the alternative design of FIG. 6, is that a package lid 130 including a thicker inner lid plate portion 132*d* (e.g., where 3.5>H2/H1>1) may help to further reduce a stress on the high CTE region 120*a* of the interposer module 120. That is, a thicker inner lid plate portion 132*d* may help to further reduce a risk that a material in the package assembly (e.g., a material such as a polymer material that may include, for example, underfill material, molding material, etc.) may crack or delaminate.

Referring to FIGS. 1A-6, a package assembly 100 may include a package substrate 110, an interposer module 120 on the package substrate 110, and a package lid 130 on the interposer module 120 and attached to the package substrate 110. The package lid 130 may include an outer lid 131 including an outer lid material and including an outer lid plate portion 131*d*, and an inner lid 132 including an inner lid material different than the outer lid material and including an inner lid plate portion 132*d* attached to a bottom surface of the outer lid plate portion 131*d*.

In one embodiment, the inner lid material may have a coefficient of thermal expansion (CTE) less than 3 ppm/° C., and the outer lid material may have a CTE greater than the CTE of the inner lid material. In one embodiment, the outer lid plate portion 131*d* may have a first thickness H1 and the inner lid plate portion 132*d* may have a second thickness H2, and 3.5>H2/H1>0. In one embodiment, the interposer module 120 may include an interposer 122, a plurality of semiconductor devices 123*a*-123*d*, 124*a*-124*h* mounted on the interposer 122, an interposer underfill layer 126 between the interposer 122 and the plurality of semiconductor devices 123*a*-123*d*, 124*a*-124*h*, and a molding material layer 127 on the plurality of semiconductor devices 123*a*-123*d*, 124*a*-124*h*. A location of the inner lid plate portion 132*d* may correspond to at least one of a location of the interposer underfill layer 126 and a location of the molding material layer 127 in a plan view. In one embodiment, the bottom surface of the outer lid plate portion 131*d* may include an outer lid recessed portion 131*d*-R, and the inner lid plate portion 132*d* may be attached to the outer lid recessed portion 131*d*-R. The bottom surface of the outer lid plate portion 131*d* further may include an outer lid non-recessed portion 131*d*-NR having a bottom surface that may be substantially co-planar with a bottom surface of the inner lid plate portion 132*d*. A location of the outer lid non-recessed portion 131*d*-NR may correspond to a location of the plurality of semiconductor devices 123*a*-123*d*, 124*a*-124*h* in a plan view. The inner lid plate portion 132*d* may include a central region having an opening 132*d*-O, and a plurality of inwardly-projecting portions 132*d*-P projecting inwardly toward the opening 132*d*-O. The outer lid non-recessed portion 131*d*-NR may be inserted into the opening 132*d*-O of the inner lid plate portion 132*d*, and may include a plurality of outwardly-projecting portions 131*d*-P projecting outwardly from the outer lid non-recessed portion 131*d*-NR. The plurality of outwardly-projecting portions 131*d*-P of the outer lid non-recessed portion 131*d*-NR may have an interdigitated arrangement with the plurality of inwardly-projecting portions 132*d*-P of the inner lid plate portion 132*d*. The package assembly 100 may further include a thermal interface material (TIM) film 140 on the interposer module 120, and the inner lid plate portion 132*d* and the outer lid plate portion 131*d* may contact the TIM film 140. The inner lid plate portion 132*d* may be located between the interposer module 120 and the outer lid plate portion 131*d*. The outer lid 131 further may include an outer foot 131*a* attached to the package substrate 110 and the inner lid 132 further may include an inner foot 132*a* attached to the package substrate 110, and a length of the outer foot 131*a* may be substantially the same as a length of the inner foot 132*a*.

Referring to FIGS. 2A-5, a method of making a package assembly 100 may include forming a package lid 130 including forming an outer lid 131 including an outer lid material and including an outer lid plate portion 131*d*, forming an inner lid 132 including an inner lid material different than the outer lid material and including an inner lid plate portion 132*d*, and attaching the inner lid plate portion 132*d* to a bottom surface of the outer lid plate portion 131*d*. The method may further include mounting an interposer module 120 on a package substrate 110, and locating the package lid 130 over the interposer module 120 and attaching the package lid 130 to the package substrate 110. The inner lid material may have a coefficient of thermal expansion (CTE) less than 3 ppm/° C., and the outer lid material may have a CTE greater than the CTE of the inner lid material. The forming of the outer lid 131 may include forming the outer lid plate portion 131*d* to have a first thickness H1, and the forming of the inner lid 132 may include forming the inner lid plate portion 132*d* to have a second thickness H2, wherein 3.5>H2/H1>0. The forming of the package lid 130 further may include applying adhesive to an outer lid recessed portion 131*d*-R in the bottom surface of the outer lid plate portion 131*d*, and pressing the inner lid plate portion 132*d* into the outer lid recessed portion 131*d*-R so that the inner lid plate portion 132*d* may be fixed to the outer lid recessed portion 131*d*-R by the adhesive. The forming of the inner lid 132 may include forming an opening 132*d*-O in the inner lid plate portion 132*d*, and forming a plurality of inwardly-projecting portions 132*d*-P projecting inwardly toward the opening 132*d*-O. The forming of the outer lid 131 may include forming an outer lid non-recessed portion 131*d*-NR in a bottom surface of the outer lid plate portion 131*d*, and forming a plurality of outwardly-projecting portions 131*d*-P projecting outwardly from the outer lid non-recessed portion 131*d*-NR. The attaching of the inner lid plate portion 132*d* to the bottom surface of the outer lid plate portion 131*d* may include inserting the outer lid non-recessed portion 131*d*-NR into the opening 132*d*-O of the inner lid plate portion 132*d*, so that the plurality of outwardly-projecting portions 131*d*-P of the outer lid non-recessed portion 131*d*-NR has an interdigitated arrangement with the plurality of inwardly-projecting portions 132*d*-P of the inner lid plate portion 132*d*.

Referring to FIGS. 1A-6, a package lid 130 for a package assembly 100 may include an outer lid 131 including an outer lid material and including an outer lid plate portion 131d including an outer lid recessed portion 131d-R in a bottom surface of the outer lid plate portion 131d and having a first thickness H1, and an outer lid non-recessed portion 131d-NR in the bottom surface of the outer lid plate portion 131d, and including a plurality of outwardly-projecting portions 131d-P projecting outwardly from the outer lid non-recessed portion 131d-NR. The package lid 130 may further include an inner lid 132 including an inner lid material having a coefficient of thermal expansion (CTE) less than 3 ppm/° C., and including an inner lid plate portion 132d attached to the outer lid recessed portion 132d-R and having a second thickness H2, wherein 3.5>H2/H1>0, the inner lid plate portion 132d including a central region including an opening 132d-O, the outer lid non-recessed portion 131d-NR being inserted into the opening 132d-O, and a plurality of inwardly-projecting portions 132d-P projecting inwardly into the opening 132d-O, and having an interdigitated arrangement with the plurality of outwardly-projecting portions 131d-P of the outer lid non-recessed portion 131d-NR.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package assembly, comprising:
    a package substrate;
    an interposer module on the package substrate; and
    a package lid on the interposer module and attached to the package substrate, comprising:
        an outer lid comprising an outer lid material and including an outer lid plate portion having a bottom surface and an outer lid recessed portion in the bottom surface; and
        an inner lid comprising an inner lid material different than the outer lid material and including an inner lid plate portion attached to the outer lid recessed portion.

2. The package assembly of claim 1, wherein the inner lid material has a coefficient of thermal expansion (CTE) less than 3 ppm/° C., and the outer lid material has a CTE greater than the CTE of the inner lid material.

3. The package assembly of claim 1, wherein the outer lid plate portion has a first thickness H1 and the inner lid plate portion has a second thickness H2, and 3.5>H2/H1>0.

4. The package assembly of claim 1, wherein the interposer module comprises:
    an interposer;
    a plurality of semiconductor devices mounted on the interposer;
    an interposer underfill layer between the interposer and the plurality of semiconductor devices; and
    a molding material layer on the plurality of semiconductor devices.

5. The package assembly of claim 4, wherein a location of the inner lid plate portion corresponds to at least one of a location of the interposer underfill layer and a location of the molding material layer in a plan view.

6. The package assembly of claim 4, wherein the bottom surface of the outer lid plate portion further comprises an outer lid non-recessed portion having a bottom surface that is substantially co-planar with a bottom surface of the inner lid plate portion.

7. The package assembly of claim 6, wherein a location of the outer lid non-recessed portion corresponds to a location of the plurality of semiconductor devices in a plan view.

8. The package assembly of claim 6, wherein the inner lid plate portion includes a central region having an opening, and a plurality of inwardly-projecting portions projecting inwardly toward the opening.

9. The package assembly of claim 8, wherein the outer lid non-recessed portion is inserted into the opening of the inner lid plate portion, and includes a plurality of outwardly-projecting portions projecting outwardly from the outer lid non-recessed portion.

10. The package assembly of claim 9, wherein the plurality of outwardly-projecting portions of the outer lid non-recessed portion has an interdigitated arrangement with the plurality of inwardly-projecting portions of the inner lid plate portion.

11. The package assembly of claim 4, further comprising:
    a thermal interface material (TIM) film on the interposer module, wherein the inner lid plate portion and the outer lid plate portion contact the TIM film.

12. The package assembly of claim 1, wherein the inner lid plate portion is located between the interposer module and the outer lid plate portion.

13. The package assembly of claim 1, wherein the outer lid further comprises an outer foot attached to the package substrate and the inner lid further comprises an inner foot attached to the package substrate, and a length of the outer foot is substantially the same as a length of the inner foot.

14. A package lid for a package assembly, comprising:
    an outer lid including an outer lid material and including an outer lid plate portion comprising:
        an outer lid recessed portion in a bottom surface of the outer lid plate portion; and
        an outer lid non-recessed portion in the bottom surface of the outer lid plate portion, and including a plurality of outwardly-projecting portions projecting outwardly from the outer lid non-recessed portion; and
    an inner lid including an inner lid material having a coefficient of thermal expansion (CTE) less than a coefficient of thermal expansion of the outer lid, and including an inner lid plate portion attached to the outer lid recessed portion, the inner lid plate portion comprising:
        a central region including an opening, the outer lid non-recessed portion being inserted into the opening; and
        a plurality of inwardly-projecting portions projecting inwardly into the opening, and having an interdigitated arrangement with the plurality of outwardly-projecting portions of the outer lid non-recessed portion.

15. A package assembly, comprising:
    a package substrate;

a semiconductor module on the package substrate, including a semiconductor die region and a high coefficient of thermal expansion (CTE) region adjacent the semiconductor die region; and a package lid on the semiconductor module and attached to the package substrate, comprising:

an outer lid located over the semiconductor die region of the semiconductor module, wherein the outer lid comprises an outer lid plate portion having a bottom surface and an outer lid recessed portion in the bottom surface; and an inner lid including an inner lid plate portion attached to the outer lid recessed portion and located over the high CTE region of the semiconductor module.

16. The package assembly of claim 15, wherein the outer lid comprises an outer lid material having a first coefficient of thermal expansion (CTE), and the inner lid comprises an inner lid material having a second CTE less than the first CTE.

17. The package assembly of claim 15, wherein the semiconductor module comprises:

an interposer;

a plurality of semiconductor dies on the interposer; and an underfill layer between the interposer and the plurality of semiconductor dies, wherein the underfill layer is in the high CTE region of the semiconductor module.

18. The package assembly of claim 17, wherein the semiconductor module further comprises a molding material layer on the plurality of semiconductor dies, wherein the molding material layer is in the high CTE region of the semiconductor module.

19. The package assembly of claim 15, further comprising:

a thermal interface material (TIM) layer on the semiconductor module, comprising:

a first portion between the outer lid and the semiconductor die region of the semiconductor module; and a second portion between the inner lid and the high CTE region of the semiconductor module.

20. The package assembly of claim 15, wherein a thickness of the inner lid plate portion is greater than a thickness of the outer lid plate portion at the outer lid recessed portion.

* * * * *